(12) United States Patent
MacDonald et al.

(10) Patent No.: US 11,912,730 B2
(45) Date of Patent: Feb. 27, 2024

(54) ORGANOAMINO-FUNCTIONALIZED CYCLIC OLIGOSILOXANES FOR DEPOSITION OF SILICON-CONTAINING FILMS

(71) Applicant: VERSUM MATERIALS US, LLC, Tempe, AZ (US)

(72) Inventors: Matthew R. MacDonald, Laguna Niguel, CA (US); John F. Lehmann, Schnecksville, PA (US)

(73) Assignee: Versum Materials US, LLC, Tempe, AZ (US)

( * ) Notice: Subject to any disclaimer, the term of this patent is extended or adjusted under 35 U.S.C. 154(b) by 109 days.

(21) Appl. No.: 18/066,903

(22) Filed: Dec. 15, 2022

(65) Prior Publication Data
US 2023/0138138 A1    May 4, 2023

Related U.S. Application Data

(60) Division of application No. 17/030,187, filed on Sep. 23, 2020, now abandoned, which is a continuation-in-part of application No. 16/838,997, filed on Apr. 2, 2020, now abandoned.

(60) Provisional application No. 62/829,851, filed on Apr. 5, 2019.

(51) Int. Cl.
| | | |
|---|---|---|
| C23C 16/52 | (2006.01) | |
| C07F 7/08 | (2006.01) | |
| C23C 16/455 | (2006.01) | |
| C23C 16/40 | (2006.01) | |

(52) U.S. Cl.
CPC .......... C07F 7/0816 (2013.01); C23C 16/402 (2013.01); C23C 16/45553 (2013.01); C23C 16/52 (2013.01); C23C 16/45504 (2013.01)

(58) Field of Classification Search
CPC ............... C23C 16/45553; C23C 16/45504
See application file for complete search history.

(56) References Cited

U.S. PATENT DOCUMENTS

| | | | |
|---|---|---|---|
| 5,330,836 A | 7/1994 | Buese | |
| 7,084,076 B2 | 8/2006 | Park | |
| 8,912,353 B2 | 12/2014 | Xiao | |
| 8,940,648 B2 | 1/2015 | Xiao | |
| 9,005,719 B2 | 4/2015 | Xiao | |
| 9,245,740 B2 | 1/2016 | Jang | |
| 9,337,018 B2 | 5/2016 | Xiao | |
| 9,337,054 B2 | 5/2016 | Hunks | |
| 10,822,458 B2 | 11/2020 | Xiao | |
| 11,098,069 B2 | 8/2021 | MacDonald | |
| 2010/0052114 A1* | 3/2010 | Hara | H01L 21/02123 257/632 |
| 2011/0262642 A1* | 10/2011 | Xiao | H01L 21/02222 427/255.394 |
| 2015/0275355 A1 | 1/2015 | Mallikarjunan | |
| 2015/0087139 A1 | 3/2015 | O'Neill | |
| 2015/0147871 A1* | 5/2015 | Xiao | H01L 21/02274 556/412 |
| 2015/0376211 A1 | 12/2015 | Girard | |
| 2016/0049293 A1* | 2/2016 | Li | H01L 21/02214 438/780 |
| 2018/0223047 A1 | 8/2018 | Xiao | |
| 2019/0233446 A1* | 8/2019 | MacDonald | C07F 7/21 |
| 2019/0318925 A1* | 10/2019 | Lei | H01L 21/02164 |
| 2020/0248309 A1 | 8/2020 | Wang | |
| 2021/0017198 A1 | 1/2021 | MacDonald | |
| 2021/0017339 A1 | 1/2021 | Xiao | |

FOREIGN PATENT DOCUMENTS

| | | |
|---|---|---|
| DE | 1171235 B | 5/1964 |
| JP | S38-20468 B | 10/1963 |
| JP | S59-004670 A | 1/1984 |
| JP | H05-279856 A | 10/1993 |
| WO | 2015/105337 A1 | 7/2015 |
| WO | 2015/105350 A1 | 7/2015 |

OTHER PUBLICATIONS

CAS Abstract and Indexed Compound, E. Morehouse, DE 1171235, May 1964.
CAS Registry No. RN 90332-55-1, Nov. 1984.

\* cited by examiner

*Primary Examiner* — Margaret G Moore
(74) *Attorney, Agent, or Firm* — David K. Benson

(57) ABSTRACT

Amino-functionalized cyclic oligosiloxanes, which have at least three silicon and three oxygen atoms as well as at least one organoamino group and methods for making the oligosiloxanes are disclosed. Methods for depositing silicon and oxygen containing films using the organoamino-functionalized cyclic oligosiloxanes are also disclosed.

5 Claims, 3 Drawing Sheets

ORGANOAMINO-FUNCTIONALIZED CYCLIC OLIGOSILOXANES FOR DEPOSITION OF SILICON-CONTAINING FILMS

CROSS REFERENCE TO RELATED PATENT APPLICATIONS

This present application is a Divisional of U.S. application Ser. No. 17/030,187, filed Sep. 23, 2020 and now abandoned, application Ser. No. 17/030,187 claims the benefit of U.S. Non-Provisional application Ser. No. 16/838,997 filed on Apr. 2, 2020 and now abandoned, which claims benefit of U.S. Provisional application No. 62/829,851 filed on Apr. 5, 2019. All previous applications are hereby fully incorporated by reference.

BACKGROUND

The invention relates to organosilicon compounds that can be used to deposit silicon and oxygen containing films (e.g., silicon oxide, silicon oxycarbonitride, silicon oxycarbide, carbon-doped silicon oxide, among other silicon and oxygen containing films), methods for using the compounds for depositing silicon oxide containing films as well as films obtained from the compounds and methods.

Described herein are novel organoamino-functionalized cyclic oligosiloxane precursor compounds and compositions and methods comprising same to deposit a silicon-containing film such as, without limitation, silicon oxide, silicon oxynitride, silicon oxycarbonitride, or carbon-doped silicon oxide via a thermal atomic layer deposition (ALD) or plasma enhanced atomic layer deposition (PEALD) process, or a combination thereof. More specifically, described herein is a composition and method for formation of a stoichiometric or a non-stoichiometric silicon-containing film or material at one or more deposition temperatures of about 600° C. or less including, for example, from about 25° C. to about 300° C.

Atomic Layer Deposition (ALD) and Plasma Enhanced Atomic Layer Deposition (PEALD) are processes used to deposit, for example, silicon oxide conformal films at low temperature (<500° C.). In both ALD and PEALD processes, the precursor and reactive gas (such as oxygen or ozone) are separately pulsed in certain number of cycles to form a monolayer of silicon oxide at each cycle. However, silicon oxide deposited at low temperatures using these processes may contain levels of impurities such as, without limitation, carbon (C) or hydrogen (H), which may be detrimental in certain semiconductor applications. To remedy this, one possible solution is to increase the deposition temperature to 500° C. or greater. However, at these higher temperatures, conventional precursors employed by semiconductor industries tend to self-react, thermally decompose, and deposit in a chemical vapor deposition (CVD) mode rather than an ALD mode. The CVD mode deposition has reduced conformality compared to ALD deposition, especially for high aspect ratio structures which are needed in many semiconductor applications. In addition, the CVD mode deposition has less control of film or material thickness than the ALD mode deposition.

Organoaminosilane and chlorosilane precursors are known in the art that can be used to deposit silicon-containing films via Atomic Layer Deposition (ALD) and Plasma Enhanced Atomic Layer Deposition (PEALD) processes at a relatively low temperature (<300° C.) and with relatively high Growth Per Cycle (GPC >1.5 Å/cycle).

Examples of known precursors and methods are disclosed in the following publications, patents, and patent applications.

U.S. Pat. No. 7,084,076 B2 describes the use of a halogen- or NCO-substituted disiloxane precursor to deposit a silicon oxide film using in a base-catalyzed ALD process.

US Pub. No. 2015087139 AA describes the use of amino-functionalized carbosilanes to deposit silicon containing films via thermal ALD or PEALD processes.

U.S. Pat. No. 9,337,018 B2 describes the use of organoaminodisilanes to deposit silicon containing films via thermal ALD or PEALD processes.

U.S. Pat. Nos. 8,940,648 B2, 9,005,719 B2, and 8,912,353 B2 describe the use of organoaminosilanes to deposit silicon containing films via thermal ALD or PEALD processes.

US Pub. No. 2015275355 AA describes the use of mono- and bis(organoamino)alkylsilanes to deposit silicon containing films via thermal ALD or PEALD processes.

US Pub. No. 2015376211A describes the use of mono (organoamino)-, halido-, and pseudohalido-substituted trisilylamines to deposit silicon containing films via thermal ALD or PEALD processes.

Pub No. WO15105337 and U.S. Pat. No. 9,245,740 B2 describe the use of alkylated trisilylamines to deposit silicon containing films via thermal ALD or PEALD processes.

Pub. No. WO15105350 describes the use of 4-membered ring cyclodisilazanes having at least one Si—H bond to deposit silicon containing films via thermal ALD or PEALD processes.

U.S. Pat. No. 7,084,076 B2 describes the use of a halogen- or NCO-substituted disiloxane precursor to deposit a silicon oxide film using in a base-catalyzed ALD process.

Pub No. US2018223047A discloses amino-functionalized linear and cyclic oligosiloxanes, which have at least two silicon and two oxygen atoms as well as an organoamino group and methods for depositing silicon and oxygen containing films.

The disclosure of the previously identified patents and patent applications is hereby incorporated by reference.

Despite the above-mentioned developments, there is a need in the art for precursors and methods for depositing silicon-oxide containing films at high growth per cycle (GPC) in order to maximize throughput in a semiconductor manufacturing facility. Although certain precursors are capable of deposition at >2.0 Å/cycle GPC, these precursors have disadvantages such as low-quality film (elemental contamination, low-density, poor electrical properties, high wet etch rate), high process temperatures, requires a catalyst, cost, produce low conformality films, among others.

SUMMARY

The present development solves problems associated with conventional precursors and processes by providing silicon- and oxygen-containing precursors, specifically organoamino-functionalized cyclic oligosiloxanes, which have at least three silicon and three oxygen atoms as well as at least one organoamino group that serves to anchor the cyclic oligosiloxane unit to the surface of a substrate as part of a process to deposit a silicon and oxygen containing film. The multi-silicon precursors disclosed in this invention have novel structures compared to those described in the above background section and, therefore, may provide an advantage in one or more aspects with respect to either cost or convenience of precursor synthesis, physical properties of the precursor including thermal stability, reactivity, or volatility, the process of depositing a silicon-containing film, or the properties of the deposited silicon-containing film.

Disclosed herein is a composition comprising at least one organoamino-functionalized cyclic oligosiloxane compound selected from the group consisting of Formulae A-D:

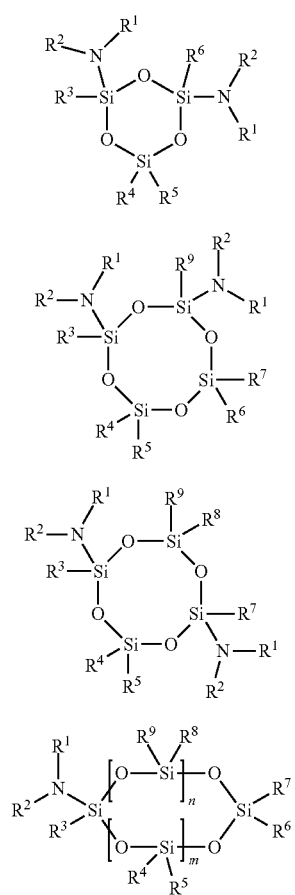

wherein R1 is selected from the group consisting of a linear C1 to C10 alkyl group, a branched C3 to C10 alkyl group, a C3 to C10 cyclic alkyl group, a C3 to C10 heterocyclic group, a C3 to C10 alkenyl group, a C3 to C10 alkynyl group, and a C4 to C10 aryl group; R2 is selected from the group consisting of hydrogen, a C1 to C10 linear alkyl group, a branched C3 to C10 alkyl group, a C3 to C10 cyclic alkyl group, a C3 to C10 heterocyclic group, a C3 to C10 alkenyl group, a C3 to C10 alkynyl group, and a C4 to C10 aryl group, wherein R1 and R2 are either linked to form a cyclic ring structure or are not linked to form a cyclic ring structure; R3-11 are each independently selected from the group consisting of hydrogen, a linear C1 to C10 alkyl group, a branched C3 to C10 alkyl group, a C3 to C10 cyclic alkyl group, a C2 to C10 alkenyl group, a C2 to C10 alkynyl group, a C4 to C10 aryl group, and an organoamino group, NR1R2, wherein R1 and R2 are defined above; n=1, 2, or 3, and m=2 or 3.

Described herein is a process for the deposition of a stoichiometric or nonstoichiometric silicon and oxygen containing material or film, such as without limitation, a silicon oxide, a carbon doped silicon oxide, a silicon oxynitride film, or a carbon doped silicon oxynitride film at relatively low temperatures, e.g., at one or more temperatures of 600° C. or lower, in a plasma enhanced ALD (PEALD), plasma enhanced cyclic chemical vapor deposition (PECCVD), a flowable chemical vapor deposition (FCVD), a plasma enhanced flowable chemical vapor deposition (PEFCVD), a plasma enhanced ALD-like process, or an ALD process with oxygen-containing reactant source, a nitrogen-containing reactant source, or a combination thereof.

In one aspect, disclosed herein is a method for depositing a film comprising silicon and oxygen onto a substrate, the method comprising the steps of: (a) providing a substrate in a reactor; (b) introducing into the reactor at least one silicon precursor compound selected from the group consisting of Formulae A-D:

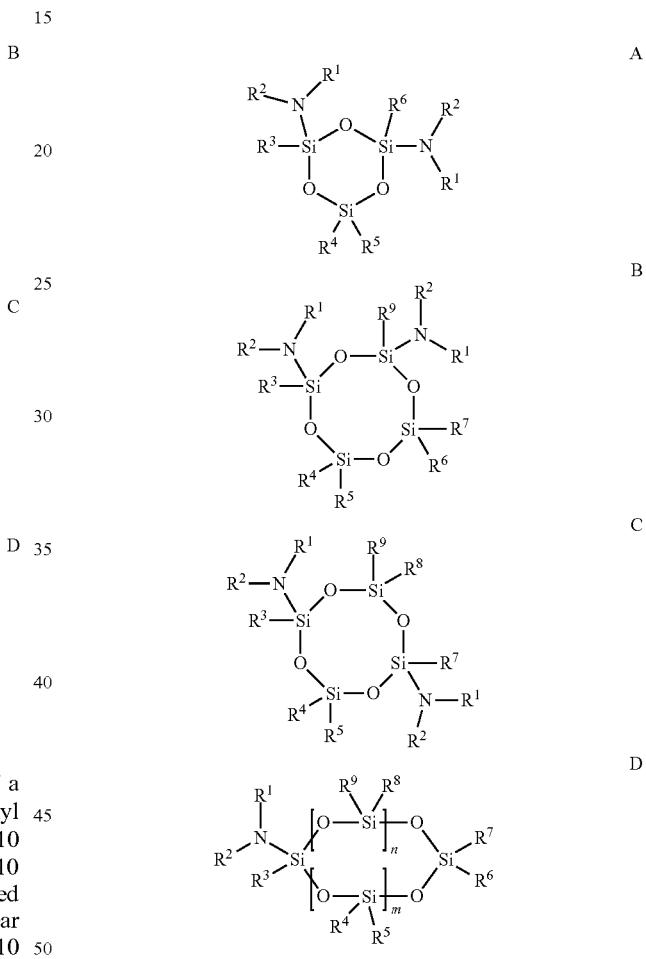

wherein R1 is selected from the group consisting of a linear C1 to C10 alkyl group, a branched C3 to C10 alkyl group, a C3 to C10 cyclic alkyl group, a C3 to C10 heterocyclic group, a C3 to C10 alkenyl group, a C3 to C10 alkynyl group, and a C4 to C10 aryl group; R2 is selected from the group consisting of hydrogen, a C1 to C10 linear alkyl group, a branched C3 to C10 alkyl group, a C3 to C10 cyclic alkyl group, a C3 to C10 heterocyclic group, a C3 to C10 alkenyl group, a C3 to C10 alkynyl group, and a C4 to C10 aryl group, wherein R1 and R2 are either linked to form a cyclic ring structure or are not linked to form a cyclic ring structure; R3-11 are each independently selected from the group consisting of hydrogen, a linear C1 to C10 alkyl group, a branched C3 to C10 alkyl group, a C3 to C10 cyclic alkyl group, a C2 to C10 alkenyl group, a C2 to C10 alkynyl group, a C4 to C10 aryl group, and an organoamino group, NR1 R2, wherein R1 and R2 are defined above; n=1, 2, or 3, and m=2 or 3; (c) purging the reactor with a purge gas; (d) introducing at least one of an oxygen-containing source and a nitrogen-containing source into the reactor; and (d) purging the reactor with the purge gas, wherein the steps b through e are repeated until a desired thickness of film is deposited; and wherein the method is conducted at one or more temperatures ranging from about 25° C. to 600° C.

Methods of making the above compounds are also disclosed herein. The embodiments of the invention can be used alone or in combinations with each other.

DETAILED DESCRIPTION

Figure 1:
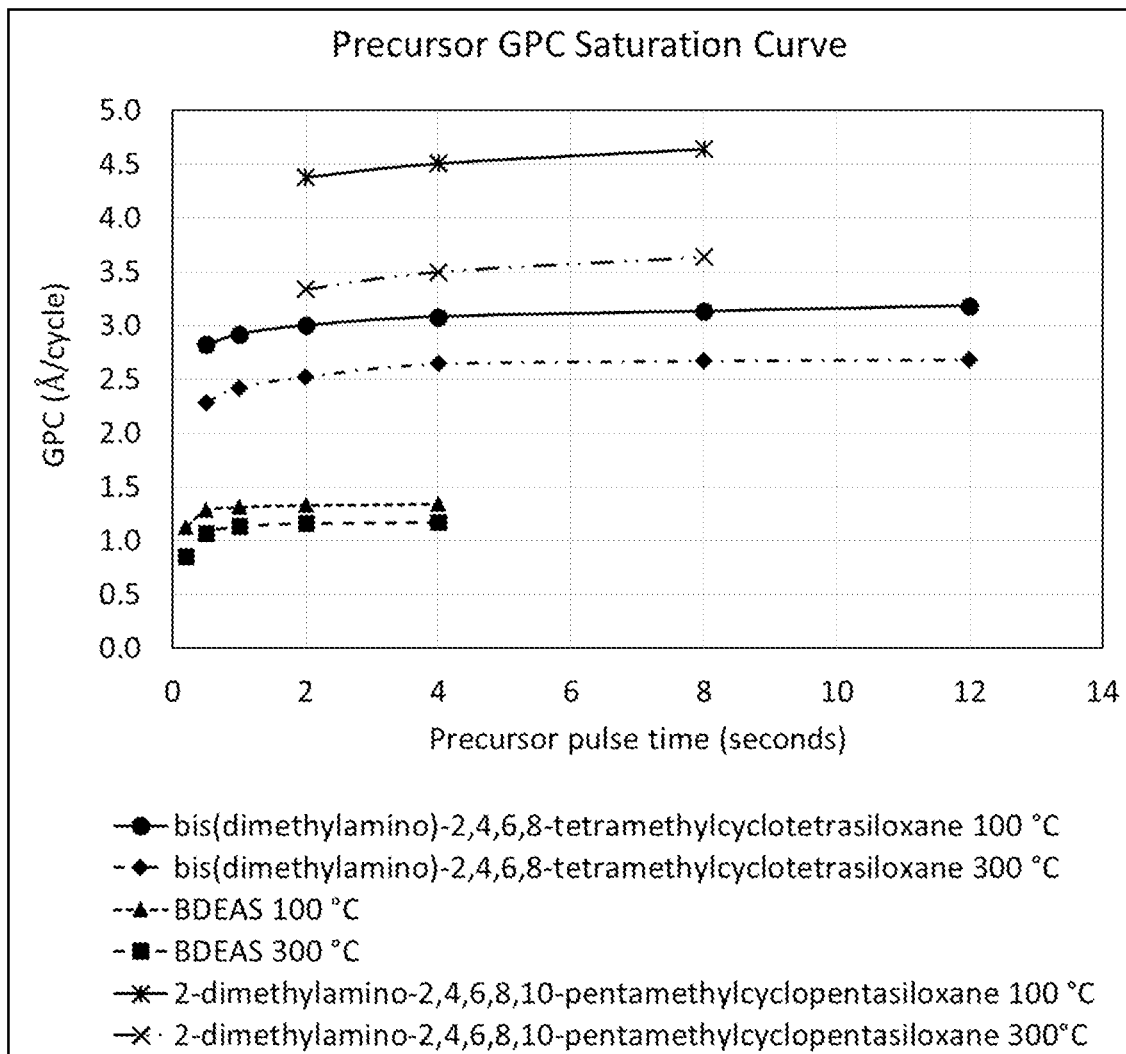
FIG. 1 is a graph of saturation curves of GPC versus precursor pulse time using bis(dimethylamino)-2,4,6,8-tetramethylcyclotetrasiloxane and 2-dimethylamino-2,4,6,8,10-pentamethylcyclopentasiloxane according to the present invention as well as BDEAS of the prior art.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Described herein are compositions and methods related to the formation of a stoichiometric or nonstoichiometric film or material comprising silicon and oxygen such as, without limitation, a silicon oxide, a carbon-doped silicon oxide film, a silicon oxynitride, or a carbon-doped silicon oxynitride film or combinations thereof with one or more temperatures, of about 600° C. or less, or from about 25° C. to about 600° C. and, in some embodiments, from 25° C. to about 300° C. The films described herein are deposited in a deposition process such as an atomic layer deposition (ALD) or in an ALD-like process such as, without limitation, a plasma enhanced ALD (PEALD) or a plasma enhanced cyclic chemical vapor deposition process (PECCVD), a flowable chemical vapor deposition (FCVD), or a plasma enhanced flowable chemical vapor deposition (PEFCVD). The low temperature deposition (e.g., one or more deposition temperatures ranging from about ambient temperature to 600° C.) methods described herein provide films or materials that exhibit at least one or more of the following advantages: a density of about 2.1 g/cc or greater, low chemical impurity, high conformality in a thermal atomic layer deposition, a plasma enhanced atomic layer deposition (ALD) process or a plasma enhanced ALD-like process, an ability to adjust carbon content in the resulting film; and/or films have an etching rate of 5 Angstroms per second (A/sec) or less when measured in 0.5 wt % dilute HF. For carbon-doped silicon oxide films, greater than 1% carbon is desired to tune the etch rate to values below 2 Å/sec in 0.5 wt % dilute HF in addition to other characteristics such as, without limitation, a density of about 1.8 g/cc or greater or about 2.0 g/cc or greater.

Methods disclosed herein can be practiced using equipment known in the art. For example, methods can employ a reactor that is conventional in the semiconductor manufacturing art.

Without wishing to be bound by any theory or explanation, it is believed that the effectiveness of the precursor compositions disclosed herein can vary as a function of the number of silicon atoms and, in particular, the silicon atom bonds. The precursors disclosed herein typically have between 3 and 8 silicon atoms, and between 6 and 16 silicon-oxygen bonds.

The precursors disclosed herein have different structures than known in this art and, therefore, are able to perform better than conventional silicon-containing precursors and provide relatively high GPC, yielding a higher quality film, having a favorable wet etch rate, or having less elemental contaminations.

Disclosed here is a composition for depositing a film selected from a silicon oxide, a carbon-doped silicon oxide, or a silicon carboxynitride film using a vapor deposition process, the composition comprising a compound having Formulae A-D:

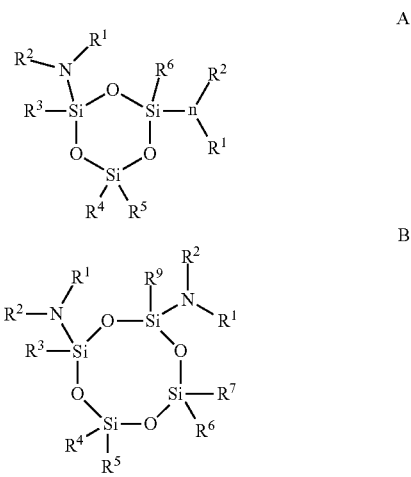

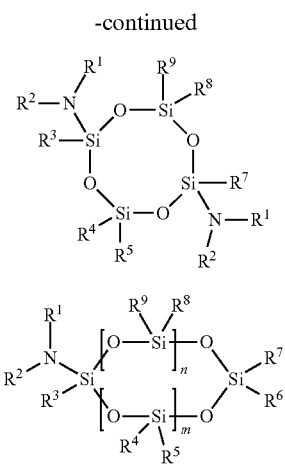

C

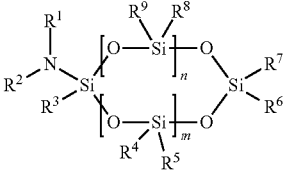

D wherein $R^1$ is selected from the group consisting of a linear $C_1$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group; $R^2$ is selected from the group consisting of hydrogen, a $C_1$ to $C_{10}$ linear alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group, wherein $R^1$ and $R^2$ are either linked to form a cyclic ring structure or are not linked to form a cyclic ring structure; $R^{3-11}$ are each independently selected from the group consisting of hydrogen, a linear $C_1$ to $C_{10}$ alkyl group, a branched $C_3$ to $C_{10}$ alkyl group, a $C_3$ to $C_{10}$ cyclic alkyl group, a $C_2$ to $C_{10}$ alkenyl group, a $C_2$ to $C_{10}$ alkynyl group, a $C_4$ to $C_{10}$ aryl group, and an organoamino group, $NR^1R^2$, wherein $R^1$ and $R^2$ are defined above; n=1, 2, or 3; and m=2 or 3.

In a preferred embodiment, at least one of R1-9 is a C1 to C4 alkyl group. A preferred embodiment includes compounds of Formulae A-D, wherein each of R1-9 is either hydrogen or a C1 to C4 alkyl group.

In the formulae above and throughout the description, the term "oligosiloxane" denotes a compound comprising at least two repeating —Si—O— siloxane units, preferably at least three repeating —Si—O— siloxane units, and may be a cyclic or linear structure, preferably a cyclic structure.

In the formulae above and throughout the description, the term "alkyl" denotes a linear or branched functional group having from 1 to 10 carbon atoms. Exemplary linear alkyl groups include, but are not limited to, methyl, ethyl, propyl, butyl, pentyl, and hexyl groups. Exemplary branched alkyl groups include, but are not limited to, iso-propyl, iso-butyl, sec-butyl, tert-butyl, iso-pentyl, tert-pentyl, iso-hexyl, and neo-hexyl. In certain embodiments, the alkyl group may have one or more functional groups attached thereto such as, but not limited to, an alkoxy group, a dialkylamino group or combinations thereof, attached thereto. In other embodiments, the alkyl group does not have one or more functional groups attached thereto. The alkyl group may be saturated or, alternatively, unsaturated.

In the formulae above and throughout the description, the term "cyclic alkyl" denotes a cyclic functional group having from 3 to 10 carbon atoms. Exemplary cyclic alkyl groups include, but are not limited to, cyclobutyl, cyclopentyl, cyclohexyl, and cyclooctyl groups.

In the formulae above and throughout the description, the term "alkenyl group" denotes a group which has one or more carbon-carbon double bonds and has from 2 to 10 or from 2 to 6 carbon atoms.

In the formulae described herein and throughout the description, the term "dialkylamino" group, "alkylamino" group, or "organoamino" group denotes a group R1 R2N— wherein R1 is selected from the group consisting of a linear C1 to C10 alkyl group, a branched C3 to C10 alkyl group, a C3 to C10 cyclic alkyl group, a C3 to C10 heterocyclic group, a C3 to C10 alkenyl group, a C3 to C10 alkynyl group, and a C4 to C10 aryl group and R2 is selected from the group consisting of hydrogen, a C1 to C10 linear alkyl group, a branched C3 to C10 alkyl group, a C3 to C10 cyclic alkyl group, a C3 to C10 heterocyclic group, a C3 to C10 alkenyl group, a C3 to C10 alkynyl group, and a C4 to C10 aryl group. In some cases, R1 and R2 are linked to form a cyclic ring structure, in other cases R1 and R2 are not linked to form a cyclic ring structure. Exemplary organoamino groups wherein R1 and R2 are linked to form a cyclic ring includes, but are not limited to, pyrrolidino wherein R1=propyl and R2=Me, 1,2-piperidino wherein R1=propyl and R2=Et, 2,6-dimethylpiperidino wherein R1=iso-propyl and R2=sec-butyl, and 2, 5-dimethylpyrrolidino wherein R1=R2=iso-propyl.

In the formulae above and throughout the description, the term "aryl" denotes an aromatic cyclic functional group having from 4 to 10 carbon atoms, from 5 to 10 carbon atoms, or from 6 to 10 carbon atoms. Exemplary aryl groups include, but are not limited to, phenyl, benzyl, chlorobenzyl, tolyl, o-xylyl, 1,2,3-triazolyl, pyrrrolyl, and furanyl.

Throughout the description, the term "alkyl hydrocarbon" refers a linear or branched C1 to C20 hydrocarbon, cyclic C6 to C20 hydrocarbon. Exemplary hydrocarbons include, but not limited to, heptane, octane, nonane, decane, dodecane, cyclooctane, cyclononane, and cyclodecane.

Throughout the description, the term "alkoxy" refers to a C1 to C10 —OR1 group, wherein R1 is defined as above. Exemplary alkoxy groups include, but are not limited to, methoxy, ethoxy, iso-propoxy, n-propoxy, n-butoxy, sec-butoxy, tert-butoxy, and phenoxide.

Throughout the description, the term "carboxylate" refers a C2 to C12 —OC(=O)R1 group, wherein R1 is defined as above. Exemplary carboxylate groups include, but are not limited to, acetate (—OC(=O)Me), ethyl carboxylate (—OC(=O)Et), iso-propyl carboxylate (—OC(=O)iPr), and benzoate (—OC(=O)Ph).

Throughout the description, the term "aromatic hydrocarbon" refers a C6 to C20 aromatic hydrocarbon. Exemplary aromatic hydrocarbons include, but are not limited to, toluene, and mesitylene.

In the formulae above and throughout the description, the term "heterocyclic" means a non-aromatic saturated monocyclic or multicyclic ring system of about 3 to about 10 ring atoms, preferably about 5 to about 10 ring atoms, in which one or more of the atoms in the ring system is/are element(s) other than carbon, for example nitrogen, oxygen or sulfur. Preferred heterocycles contain about 5 to about 6 ring atoms. The prefix aza, oxo or thio before heterocycle means that at least a nitrogen, oxygen or sulfur atom respectively is present as a ring atom. The heterocyclic group is optionally substituted.

Exemplary organoamino-functionalized cyclic oligosiloxanes having Formulae A-D are listed in Table 1:

TABLE 1

Exemplary organoamino-functionalized cyclic oligosiloxanes having Formulae A-D:

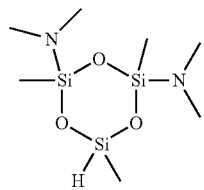

2,4-bis(dimethylamino)-
2,4,6-trimethylcyclo-
trisiloxane

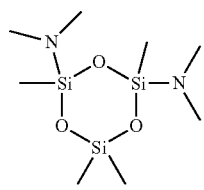

2,4-bis(dimethylamino)-
2,4,6,6-tetramethylcyclo-
trisiloxane

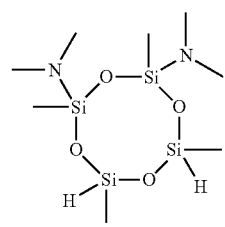

2,4-bis(dimethylamino)-
2,4,6,8-tetramethylcyclo-
tetrasiloxane

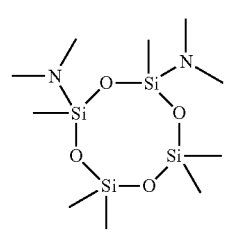

2,4-bis(dimethylamino)-
2,4,6,6,8,8-hexamethyl-
cyclotetrasiloxane

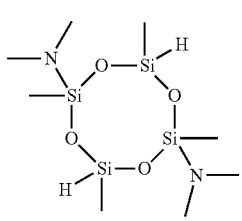

2,6-bis(dimethylamino)-
2,4,6,8-tetramethylcyclo-
tetrasiloxane

TABLE 1-continued

Exemplary organoamino-functionalized cyclic oligosiloxanes having Formulae A-D:

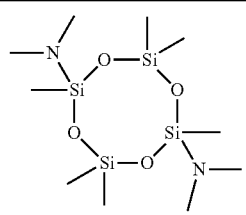

2,6-bis(dimethylamino)-
2,4,4,6,8,8-hexamethyl
cyclotetrasiloxane

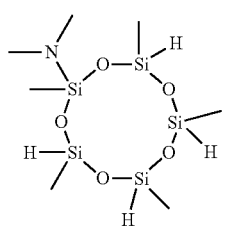

2-dimethylamino-2,4,6,8,10-
pentamethylcyclopenta-
siloxane

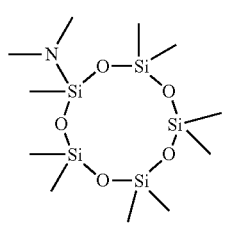

2-dimethylamino-
2,4,4,6,6,8,8,10,10-nona-
methylcyclopentasiloxane

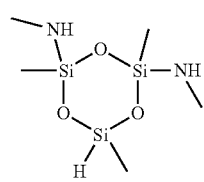

2,4-bis(methylamino)-
2,4,6-trimethylcyclotri-
siloxane

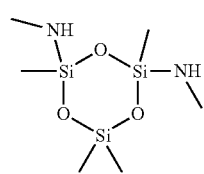

2,4-bis(methylamino)-
2,4,6,6-tetramethylcyclo-
trisiloxane

TABLE 1-continued

Exemplary organoamino-functionalized cyclic oligosiloxanes having Formulae A-D:

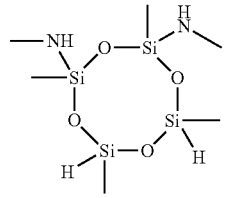

2,4-bis(methylamino)-2,4,6,8-tetramethylcyclotetrasiloxane

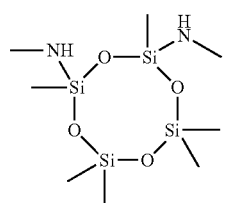

2,4-bis(methylamino)-2,4,6,6,8,8-hexamethylcyclotetrasiloxane

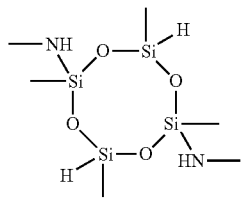

2,6-bis(methylamino)-2,4,6,8-tetramethylcyclotetrasiloxane

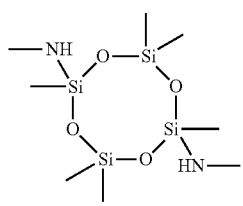

2,6-bis(methylamino)-2,4,4,6,8,8-hexamethylcyclotetrasiloxane

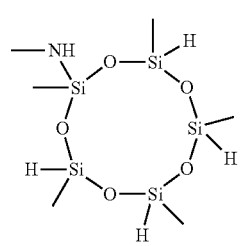

2-methylamino-2,4,6,8,10-pentamethylcyclopentasiloxane

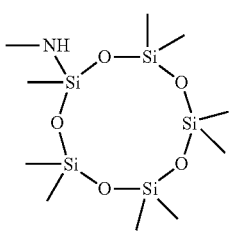

2-methylamino-2,4,4,6,6,8,8,10,10-nonamethylcyclopentasiloxane

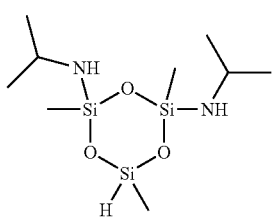 [SMILES: CC(C)N[Si]1(C)O[SiH](C)O[Si](C)(NC(C)C)O1]

2,4-bis(iso-propylamino)-2,4,6-trimethylcyclotrisiloxane

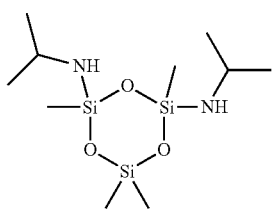 [SMILES: CC(C)N[Si]1(C)O[Si](C)(C)O[Si](C)(NC(C)C)O1]

2,4-bis(iso-propylamino)-2,4,6,6-tetramethylcyclotrisiloxane

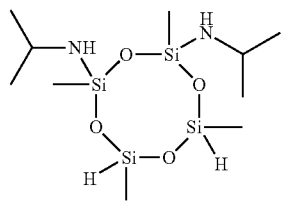 [SMILES: CC(C)N[Si]1(C)O[SiH](C)O[SiH](C)O[Si](C)(NC(C)C)O1]

2,4-bis(iso-propylamino)-2,4,6,8-tetramethylcyclotetrasiloxane

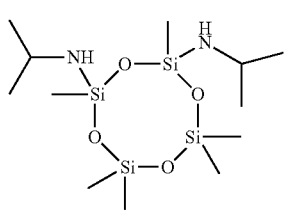 [SMILES: CC(C)N[Si]1(C)O[Si](C)(C)O[Si](C)(C)O[Si](C)(NC(C)C)O1]

2,4-bis(iso-propylamino)-2,4,6,6,8,8-hexamethylcyclotetrasiloxane

TABLE 1-continued

Exemplary organoamino-functionalized cyclic oligosiloxanes having Formulae A-D:

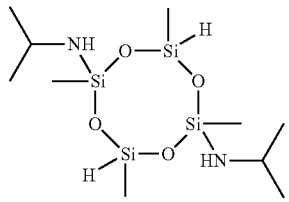 [SMILES: CC(C)N[Si]1(C)O[SiH](C)O[Si](C)(NC(C)C)O[SiH](C)O1]

2,6-bis(iso-propylamino)-2,4,6,8-tetramethylcyclotetrasiloxane

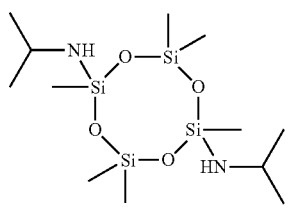 [SMILES: CC(C)N[Si]1(C)O[Si](C)(C)O[Si](C)(NC(C)C)O[Si](C)(C)O1]

2,6-bis(iso-propylamino)-2,4,4,6,8,8-hexamethylcyclotetrasiloxane

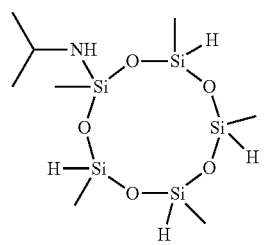 [SMILES: CC(C)N[Si]1(C)O[SiH](C)O[SiH](C)O[SiH](C)O[SiH](C)O1]

2-iso-propylamino-2,4,6,8,10-pentamethylcyclopentasiloxane

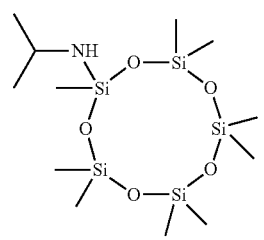 [SMILES: CC(C)N[Si]1(C)O[Si](C)(C)O[Si](C)(C)O[Si](C)(C)O[Si](C)(C)O1]

2-iso-propylamino-2,4,4,6,6,8,8,10,10-nonamethylcyclopentasiloxane

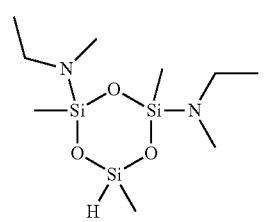 [SMILES: CCN(C)[Si]1(C)O[SiH](C)O[Si](C)(N(C)CC)O1]

2,4-bis(N-ethylmethylamino)-2,4,6-trimethylcyclotrisiloxane

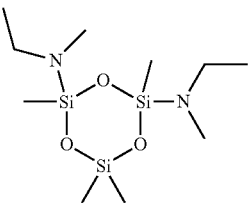 [SMILES: CCN(C)[Si]1(C)O[Si](C)(C)O[Si](C)(N(C)CC)O1]

2,4-bis(N-ethylmethylamino)-2,4,6,6-tetramethylcyclotrisiloxane

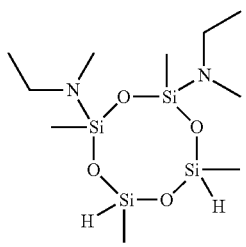 [SMILES: CCN(C)[Si]1(C)O[SiH](C)O[SiH](C)O[Si](C)(N(C)CC)O1]

2,4-bis(N-ethylmethylamino)-2,4,6,8-tetramethylcyclotetrasiloxane

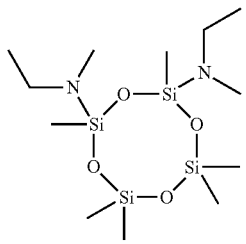 [SMILES: CCN(C)[Si]1(C)O[Si](C)(C)O[Si](C)(C)O[Si](C)(N(C)CC)O1]

2,4-bis(N-ethylmethylamino)-2,4,6,6,8,8-hexamethylcyclotetrasiloxane

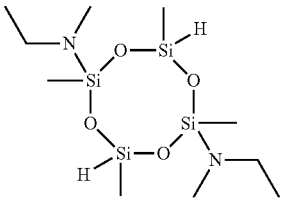 [SMILES: CCN(C)[Si]1(C)O[SiH](C)O[Si](C)(N(C)CC)O[SiH](C)O1]

2,6-bis(N-ethylmethylamino)-2,4,6,8-tetramethylcyclotetrasiloxane

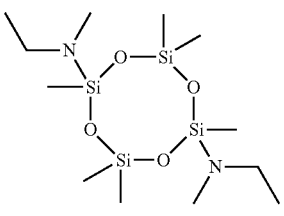 [SMILES: CCN(C)[Si]1(C)O[Si](C)(C)O[Si](C)(N(C)CC)O[Si](C)(C)O1]

2,6-bis(N-ethylmethylamino)-2,4,4,6,8,8-hexamethylcyclotetrasiloxane

TABLE 1-continued

Exemplary organoamino-functionalized cyclic oligosiloxanes having Formulae A-D:

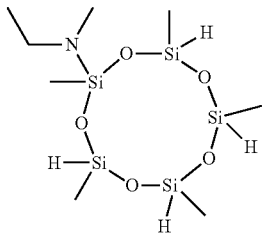 [SMILES: CCN(C)[Si]1(C)O[SiH](C)O[SiH](C)O[SiH](C)O[SiH](C)O1]

2-(N-ethylmethylamino)-2,4,6,8,10-pentamethylcyclopentasiloxane

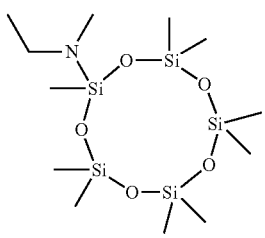 [SMILES: CCN(C)[Si]1(C)O[Si](C)(C)O[Si](C)(C)O[Si](C)(C)O[Si](C)(C)O1]

2-(N-ethylmethylamino)-2,4,4,6,6,8,8,10,10-nonamethylcyclopentasiloxane

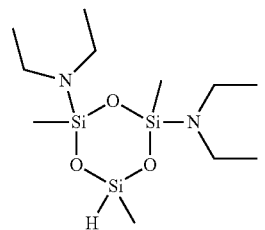 [SMILES: CCN(CC)[Si]1(C)O[SiH](C)O[Si](C)(N(CC)CC)O1]

2,4-bis(diethylamino)-2,4,6-trimethylcyclotrisiloxane

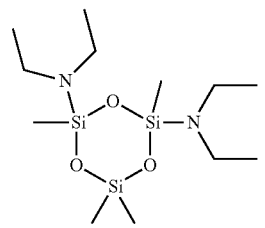 [SMILES: CCN(CC)[Si]1(C)O[Si](C)(C)O[Si](C)(N(CC)CC)O1]

2,4-bis(diethylamino)-2,4,6,6-tetramethylcyclotrisiloxane

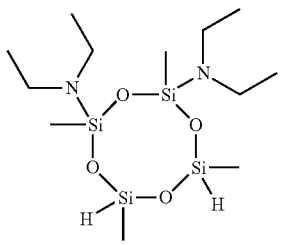 [SMILES: CCN(CC)[Si]1(C)O[SiH](C)O[SiH](C)O[Si](C)(N(CC)CC)O1]

2,4-bis(diethylamino)-2,4,6,8-tetramethylcyclotetrasiloxane

TABLE 1-continued

Exemplary organoamino-functionalized cyclic oligosiloxanes having Formulae A-D:

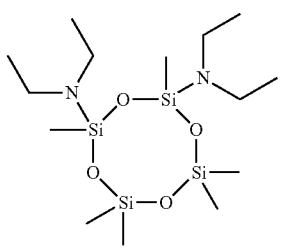 [SMILES: CCN(CC)[Si]1(C)O[Si](C)(C)O[Si](C)(C)O[Si](C)(N(CC)CC)O1]

2,4-bis(diethylamino)-2,4,6,6,8,8-hexamethylcyclotetrasiloxane

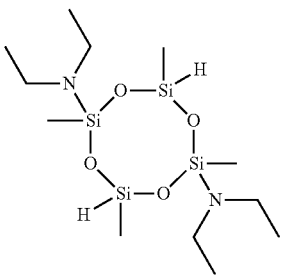 [SMILES: CCN(CC)[Si]1(C)O[SiH](C)O[Si](C)(N(CC)CC)O[SiH](C)O1]

2,6-bis(diethylamino)-2,4,6,8-tetramethylcyclotetrasiloxane

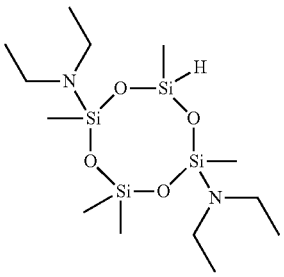 [SMILES: CCN(CC)[Si]1(C)O[SiH](C)O[Si](C)(N(CC)CC)O[Si](C)(C)O1]

2,6-bis(diethylamino)-2,4,4,6,8,8-hexamethylcyclotetrasiloxane

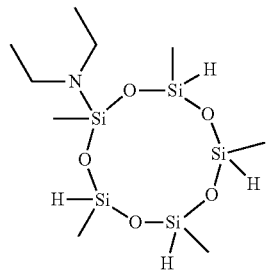 [SMILES: CCN(CC)[Si]1(C)O[SiH](C)O[SiH](C)O[SiH](C)O[SiH](C)O1]

2-diethylamino-2,4,6,8,10-pentamethylcyclopentasiloxane

TABLE 1-continued

Exemplary organoamino-functionalized cyclic oligosiloxanes having Formulae A-D:

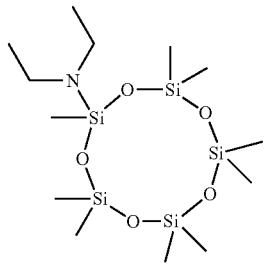 [SMILES: CCN(CC)[Si]1(C)O[Si](C)(C)O[Si](C)(C)O[Si](C)(C)O[Si](C)(C)O1]

2-diethylamino-2,4,4,6,6,8,8,10,10-nonamethylcyclopentasiloxane

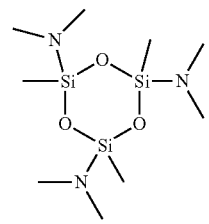

2,4,6-tris(dimethylamino)-2,4,6-trimethylcyclotrisiloxane

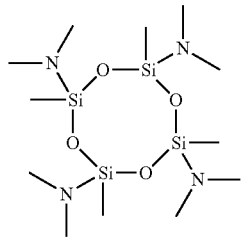

2,4,6,8-tetrakis(dimethylamino)-2,4,6,8-tetramethylcyclotetrasiloxane

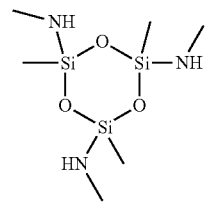

2,4,6-tris(methylamino)-2,4,6-trimethylcyclotrisiloxane

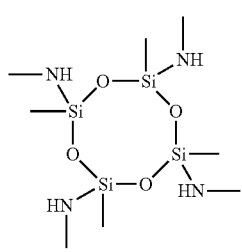

TABLE 1-continued

Exemplary organoamino-functionalized cyclic oligosiloxanes having Formulae A-D:

2,4,6,8-tetrakis(methylamino)-2,4,6,8-tetramethylcyclotetrasiloxane

Compounds having Formulae A-D can be synthesized, for example, by catalytic dehydrocoupling of cyclic oligosiloxanes having at least one Si—H bond with organoamines (e.g., Equation 1 for cyclotetrasiloxanes and Equation 3 for larger cyclic oligosiloxanes such as cyclopentasiloxanes), or reaction of chlorinated cyclic oligosiloxanes with organoamines or metal salt of organoamines (e.g., Equation 2 for cyclotetrasiloxanes), or catalytic hydrosilylation of imines by cyclic oligosiloxanes as described in U.S. Pat. No. 9,758,534 B2 for synthesis of organoaminosilanes and organoaminodisilanes, whereby cyclic oligosiloxanes are employed instead of silane or disilane.

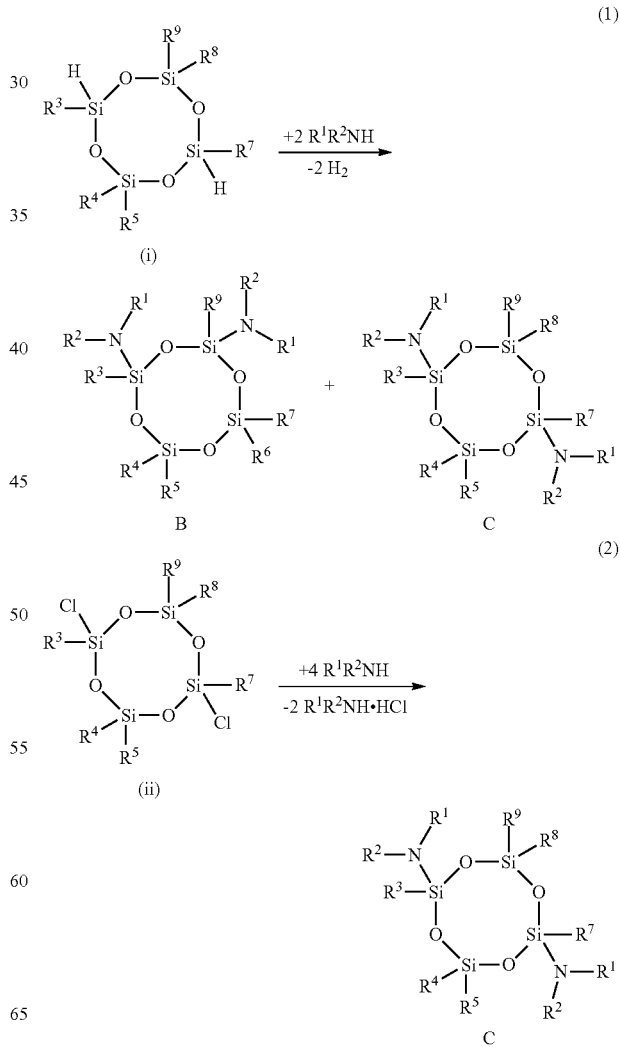

-continued

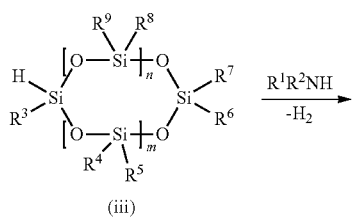

(iii)

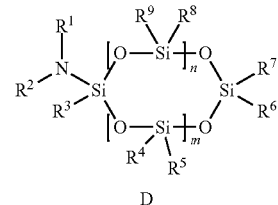

D

Preferably, the molar ratio of cyclic oligosiloxane to organoamine in the reaction mixture is from about 4 to 1, 3 to 1, 2 to 1, 1.5 to 1, 1 to 1.0, 1 to 1.5, 1 to 2, 1 to 3, 1 to 4, 1 to 8, or from 1 to 10.

The catalyst employed in the method of the present invention in Equations 1 and 3 is one that promotes the formation of a silicon-nitrogen bond. Exemplary catalysts that can be used with the method described herein include, but are not limited to the following: alkaline earth metal catalysts; halide-free main group, transition metal, lanthanide, and actinide catalysts; and halide-containing main group, transition metal, lanthanide, and actinide catalysts.

Exemplary alkaline earth metal catalysts include but are not limited to the following: Mg[N(SiMe3)2]2, ToMMgMe [ToM=tris(4,4-dimethyl-2-oxazolinyl)phenylborate], ToMMg-H, ToMMg-NR2 (R=H, alkyl, aryl) Ca[N(SiMe3)2]2, [(dipp-nacnac)CaX(THF)]2 (dipp-nacnac=CH[(CMe)(2,6-iPr2-C6H3N)]2; X=H, alkyl, carbosilyl, organoamino), Ca(CH2Ph)2, Ca(C3H5)2, Ca(α-Me3Si-2-(Me2N)-benzyl)2(THF)2, Ca(9-(Me3Si)-fluorenyl)(α-Me3Si-2-(Me2N)-benzyl)(THF), [(Me3TACD)3Ca3(μ3-H)2]+ (Me3TACD=Me3[12]aneN4), Ca(η2-Ph2CNPh)(hmpa)3 (hmpa=hexamethylphosphoramide), Sr[N(SiMe3)2]2, dialkylmagnesium and other M2+ alkaline earth metal-amide, -imine, -alkyl, -hydride, and -carbosilyl complexes (M=Ca, Mg, Sr, Ba).

Exemplary halide-free, main group, transition metal, lanthanide, and actinide catalysts include but are not limited to the following: 1,3-di-iso-propyl-4,5-dimethylimidazol-2-ylidene, 2,2'-bipyridyl, phenanthroline, B(C6F5)3, BR3 (R=linear, branched, or cyclic C1 to C10 alkyl group, a C5 to C10 aryl group, or a C1 to C10 alkoxy group), AlR3 (R=linear, branched, or cyclic C1 to C10 alkyl group, a C5 to C10 aryl group, or a C1 to C10 alkoxy group), (C5H5)2TiR2 (R=alkyl, H, alkoxy, organoamino, carbosilyl), (C5H5)2Ti(OAr)2 [Ar=(2,6-(iPr)2C6H3)], (C5H5)2Ti(SiHRR')PMe3 (wherein R, R' are each independently selected from H, Me, Ph), TiMe2(dmpe)2 (dmpe=1,2-bis(dimethylphosphino)ethane), bis(benzene)chromium(0), Cr(CO)6, Mn2(CO)12, Fe(CO)5, Fe3(CO)12, (C5H5)Fe(CO)2Me, Co2(CO)8, Ni(II) acetate, Nickel(II) acetylacetonate, Ni(cyclooctadiene)2, [(dippe)Ni(μ-H)]2 (dippe=1,2-bis(di-iso-propylphosphino)ethane), (R-indenyl)Ni(PR'3)Me (R=1-iPr, 1-SiMe3, 1,3-(SiMe3)2; R'=Me,Ph), [{Ni(η-CH2:CHSiMe2)2O}2{μ-(η-CH2:CHSiMe2)2O}], Cu(I) acetate, CuH, [tris(4,4-dimethyl-2-oxazolinyl)phenylborate]ZnH, (C5H5)2ZrR2 (R=alkyl, H, alkoxy, organoamino, carbosilyl), Ru3(CO)12, [(Et3P)Ru(2,6-dimesitylthiophenolate)][B[3,5-(CF3)2C6H3]4], [(C5Me5)Ru(R3P)x(NCMe)3-x]+(wherein R is selected from a linear, branched, or cyclic C1 to C10 alkyl group and a C5 to C10 aryl group; x=0, 1, 2, 3), Rh6(CO)16, tris(triphenylphosphine)rhodium(I)carbonyl hydride, Rh2H2(CO)2(dppm)2 (dppm=bis(diphenylphosphino)methane, Rh2(μ-SiRH)2(CO)2(dppm)2 (R=Ph, Et, C6H13), Pd/C, tris(dibenzylideneacetone)dipalladium(0), tetrakis(triphenylphosphine)palladium(0), Pd(II) acetate, (C5H5)2SmH, (C5Me5)2SmH, (THF)2Yb[N(SiMe3)2]2, (NHC)Yb(N(SiMe3)2)2 [NHC=1,3-bis(2,4,6-trimethylphenyl) imidazol-2-ylidene)], Yb(rn2-Ph2CNPh)(hmpa)3 (hmpa=hexamethylphosphoramide), W(CO)6, Re2(CO)10, Os3(CO)12, Ir4(CO)12, (acetylacetonato)dicarbonyliridium(I), Ir(Me) 2(C5Me5)L (L=PMe3, PPh3), [Ir(cyclooctadiene)OMe]2, PtO2 (Adams's catalyst), platinum on carbon (Pt/C), ruthenium on carbon (Ru/C), ruthenium on alumina, palladium on carbon, nickel on carbon, osmium on carbon, Platinum(0)-1,3-divinyl-1,1,3,3-tetramethyldisiloxane (Karstedt's catalyst), bis(tri-tert-butylphosphine)platinum(0), Pt(cyclooctadiene)2, [(Me3Si)2N]3U][BPh4], [(Et2N)3U][BPh4], and other halide-free Mn+ complexes (M=Sc, Ti, V, Cr, Mn, Fe, Co, Ni, Cu, Zn, Y, Zr, Nb, Mo, Ru, Rh, Pd, La, Ce, Pr, Nd, Pm, Sm, Eu, Gd, Tb, Dy, Ho, Er, Tm, Yb, Lu, Hf, Ta, W, Re, Os, Ir, Pt, U; n=0, 1, 2, 3, 4, 5, 6). Catalysts listed above as well as pure noble metals such as ruthenium platinum, palladium, rhodium, osmium can also be affixed to a support. The support is a solid with a high surface area. Typical support materials include but are not limited to: alumina, MgO, zeolites, carbon, monolith cordierite, diatomaceous earth, silica gel, silica/alumina, ZrO, TiO2, metal-organic frameworks (MOFs), and organic polymers such as polystyrene. Preferred supports are carbon (for examples, platinum on carbon, palladium on carbon, rhodium on carbon, ruthenium on carbon) alumina, silica and MgO. Metal loading of the catalyst ranges between about 0.01 weight percent to about 50 weight percent. A preferred range is about 0.5 weight percent to about 20 weight percent. A more preferred range is about 0.5 weight percent to about 10 weight percent. Catalysts requiring activation may be activated by a number of known methods. Heating the catalyst under vacuum is a preferred method. The catalyst may be activated before addition to the reaction vessel or in the reaction vessel prior to adding the reactants. The catalyst may contain a promoter. Promoters are substances which themselves are not catalysts, but when mixed in small quantities with the active catalysts increase their efficiency (activity and/or selectivity). Promoters are usually metals such as Mn, Ce, Mo, Li, Re, Ga, Cu, Ru, Pd, Rh, Ir, Fe, Ni, Pt, Cr, Cu and Au and/or their oxides. They can be added separately to the reactor vessel or they can be part of the catalysts themselves. For example, Ru/Mn/C (ruthenium on carbon promoted by manganese) or Pt/CeO2/Ir/SiO2 (platinum on silica promoted by ceria and iridium). Some promoters can act as catalyst by themselves but their use in combination with the main catalyst can improve the main catalyst's activity. A catalyst may act as a promoter for other catalysts. In this context, the catalyst can be called a bimetallic (or polymetallic) catalyst. For example, Ru/Rh/C can be called either ruthenium and rhodium on carbon bimetallic catalyst or ruthenium on carbon promoted by rhodium. An active catalyst is a material that acts as a catalyst in a specific chemical reaction.

Exemplary halide-containing, main group, transition metal, lanthanide, and actinide catalysts include but are not limited to the following: BX3 (X=F, Cl, Br, I), BF3·OEt2, AlX3 (X=F, Cl, Br, I), (C5H5)2TiX2 (X=F, Cl), [Mn(CO)4Br]2, NiCl2, (C5H5)2ZrX2 (X=F, Cl), PdCl2, PdI2, CuCl, CuI, CuF2, CuCl2, CuBr2, Cu(PPh3)3Cl, ZnCl2, RuCl3, [(C6H6)RuX2]2 (X=Cl, Br, I), (Ph3P)3RhCl (Wilkinson's catalyst), [RhCl(cyclooctadiene)]2, di-p-chloro-tetracarbonyldirhodium(I), bis(triphenylphosphine)rhodium(I) carbonyl chloride, NdI2, SmI2, DyI2, (POCOP)IrHCl (POCOP=2, 6-(R2PO)2C6H3; R=iPr, nBu, Me), H2PtCl6·nH2O (Speier's catalyst), PtCl2, Pt(PPh3)2Cl2, and other halide-containing Mn+ complexes (M=Sc, Ti, V, Cr, Mn, Fe, Co, Ni, Cu, Zn, Y, Zr, Nb, Mo, Ru, Rh, Pd, La, Ce, Pr, Nd, Pm, Sm, Eu, Gd, Tb, Dy, Ho, Er, Tm, Yb, Lu, Hf, Ta, W, Re, Os, Ir, Pt, U; n=0, 1, 2, 3, 4, 5, 6).

The molar ratio of catalyst to cyclic oligosiloxane in the reaction mixture ranges from 0.1 to 1, 0.05 to 1, 0.01 to 1, 0.005 to 1, 0.001 to 1, 0.0005 to 1, 0.0001 to 1, 0.00005 to 1, or 0.00001 to 1. In one particular embodiment 0.002 to 0.003 equivalents of catalyst are used per equivalent of cyclic oligosiloxane. In another particular embodiment, 0.001 equivalents of catalyst are used per equivalent of cyclic oligosiloxane.

In certain embodiments, the reaction mixture comprising the cyclic oligosiloxane, organoamine and catalyst(s) further comprises an anhydrous solvent. Exemplary solvents may include, but are not limited to linear-, branched-, cyclic- or poly-ethers (e.g., tetrahydrofuran (THF), diethyl ether, diglyme, and/or tetraglyme); linear-, branched-, or cyclic-alkanes, alkenes, aromatics and halocarbons (e.g. pentane, hexanes, toluene and dichloromethane). The selection of one or more solvent, if added, may be influenced by its compatibility with reagents contained within the reaction mixture, the solubility of the catalyst, and/or the separation process for the intermediate product and/or the end product chosen. In other embodiments, the reaction mixture does not comprise a solvent.

In the method described herein, the reaction between the cyclic oligosiloxane and the organoamine occurs at one or more temperatures ranging from about 0° C. to about 200° C., preferably 0° C. to about 100° C. Exemplary temperatures for the reaction include ranges having any one or more of the following endpoints: 0, 10, 20, 30, 40, 50, 60, 70, 80, 90, or 100° C. The suitable temperature range for this reaction may be dictated by the physical properties of the reagent, and optional solvent. Examples of particular reactor temperature ranges include but are not limited to, 0° C. to 80° C. or from 0° C. to 30° C. In some embodiments, it is preferable to keep the reaction temperature between 20° C. and 60° C.

In certain embodiments of the method described herein, the pressure of the reaction may range from about 1 to about 115 psia or from about 15 to about 45 psia. In some embodiments where the cyclic oligosiloxane is a liquid under ambient conditions, the reaction is run at atmospheric pressure. In some embodiments where the cyclic oligosiloxane is a gas under ambient conditions, the reaction is run above 15 psia.

In certain embodiments, one or more reagents may be introduced to the reaction mixture as a liquid or a vapor. In embodiments where one or more of the reagents is added as a vapor, a non-reactive gas such as nitrogen or an inert gas may be employed as a carrier gas to deliver the vapor to the reaction mixture. In embodiments where one or more of the reagents is added as a liquid, the regent may be added neat, or alternatively diluted with a solvent. The reagent is fed to the reaction mixture until the desired conversion to the crude mixture containing the organoaminosilane product, or crude liquid, has been achieved. In certain embodiments, the reaction may be run in a continuous manner by replenishing the reactants and removing the reaction products and the crude liquid from the reactor.

The crude mixture comprising compounds of Formulae A-D, catalyst(s), and potentially residual organoamine, solvent(s), or undesired product(s) may require separation process(es). Examples of suitable separation processes include, but are not limited to, distillation, evaporation, membrane separation, filtration, centrifugation, crystallization, vapor phase transfer, extraction, fractional distillation using an inverted column, and combinations thereof.

Equations 1-3 are exemplary preparative chemistries and are not meant to be limiting in any way as to the preparation of the Compounds having Formulae A-D.

The silicon precursor compounds having Formulae A-D according to the present invention and compositions comprising the silicon precursor compounds having Formulae A-D according to the present invention are preferably substantially free of halide ions. As used herein, the term "substantially free" as it relates to halide ions (or halides) such as, for example, chlorides (i.e. chloride-containing species such as HCl or silicon compounds having at least one Si—Cl bond) and fluorides, bromides, and iodides, means less than 5 ppm (by weight), preferably less than 3 ppm, and more preferably less than 1 ppm, and most preferably 0 ppm as measured by Inductively Coupled Plasma Mass Spectrometry (ICP-MS), Ion Chromatography (IC), or by any other analytical method. Chlorides are known to act as decomposition catalysts for the silicon precursor compounds having Formulae A-D. Significant levels of chloride in the final product can cause the silicon precursor compounds to degrade. The gradual degradation of the silicon precursor compounds may directly impact the film deposition process making it difficult for the semiconductor manufacturer to meet film specifications. In addition, the shelf-life or stability is negatively impacted by the higher degradation rate of the silicon precursor compounds thereby making it difficult to guarantee a 1-2 year shelf-life. Therefore, the accelerated decomposition of the silicon precursor compounds presents safety and performance concerns related to the formation of these flammable and/or pyrophoric gaseous byproducts. The silicon precursor compounds having Formulae A-D are preferably substantially free of metal ions such as Li+, Na+, K+, Mg2+, Ca2+, Al3+, Fe2+, Fe2+, Fe3+, Ni2+, Cr3+, as well as any other metal ions that may have originated from the catalyst(s) employed in the synthesis of those compounds. As used herein, the term "substantially free" as it relates to Li, Na, K, Mg, Ca, Al, Fe, Ni, Cr, and any other metal impurities, means less than 5 ppm (by weight), preferably less than 3 ppm, and more preferably less than 1 ppm, and most preferably 0.1 ppm as measured by ICP-MS. In some embodiments, the silicon precursor compounds having Formulae A-D are free of metal ions such as Li+, Na+, K+, Mg2+, Ca2+, Al3+, Fe2+, Fe2+, Fe3+, Ni2+, Cr3+, and any other metals ions that may have originated from the catalyst(s) employed in the synthesis of those compounds. As used herein, the term "free of" metal impurities as it relates to Li, Na, K, Mg, Ca, Al, Fe, Ni, Cr, and noble metals such as Ru, Rh, Pd, or Pt from catalysts used in the synthesis, means less than 1 ppm, preferably 0.1 ppm (by weight) as measured by ICP-MS or other analytical method for measuring metals.

In another embodiment, there is provided a method for depositing a film comprising silicon and oxygen onto a substrate, the method comprising the steps of:

a) providing a substrate in a reactor;
b) introducing into the reactor at least one silicon precursor compound, wherein the at least one silicon precursor selected from the group consisting of Formulae A-D:

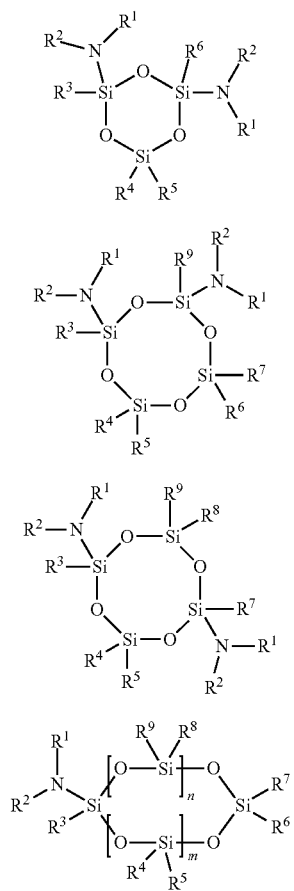

wherein $R^1$ is selected from the group consisting of a linear $C_1$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group; $R^2$ is selected from the group consisting of hydrogen, a $C_1$ to $C_{10}$ linear alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group, wherein $R^1$ and $R^2$ are either linked to form a cyclic ring structure or are not linked to form a cyclic ring structure; $R^{3-11}$ are each independently selected from the group consisting of hydrogen, a linear $C_1$ to $C_{10}$ alkyl group, a branched $C_3$ to $C_{10}$ alkyl group, a $C_3$ to $C_{10}$ cyclic alkyl group, a $C_2$ to $C_{10}$ alkenyl group, a $C_2$ to $C_{10}$ alkynyl group, a $C_4$ to $C_{10}$ aryl group, and an organoamino group, $NR^1R^2$, wherein $R^1$ and $R^2$ are defined above; n=1, 2, or 3; and m=2 or 3;
c) purging the reactor with a purge gas;
d) introducing an oxygen-containing source into the reactor; and
e) purging the reactor with the purge gas,
wherein the steps b through e are repeated until a desired thickness of film is deposited; and
wherein the method is conducted at one or more temperatures ranging from about 25° C. to 600° C.

The methods disclosed herein form a silicon oxide film comprising at least one of the following characteristics a density of at least about 2.1 g/cc; a wet etch rate that is less than about 2.5 Å/s as measured in a solution of 1:100 of HF to water dilute HF (0.5 wt. % dHF) acid; an electrical leakage of less than about 1 e-8 Å/cm2 up to 6 MV/cm; and a hydrogen impurity of less than about 5 e20 at/cc as measured by Secondary Ion Mass Spectrometry (SIMS).

In certain embodiments of the method and composition described herein, a layer of silicon-containing dielectric material, for example, is deposited on at a least a portion of a substrate via a chemical vapor deposition (CVD) process employing a reaction chamber.

Suitable substrates include, but are not limited to, semiconductor materials such as gallium arsenide ("GaAs"), silicon, and compositions containing silicon such as crystalline silicon, polysilicon, amorphous silicon, epitaxial silicon, silicon dioxide ("SiO2"), silicon glass, silicon nitride, fused silica, glass, quartz, borosilicate glass, and combinations thereof. Other suitable materials include chromium, molybdenum, and other metals commonly employed in semi-conductor, integrated circuits, flat panel display, and flexible display applications. The substrate may have additional layers such as, for example, silicon, SiO2, organosilicate glass (OSG), fluorinated silicate glass (FSG), boron carbonitride, silicon carbide, hydrogenated silicon carbide, silicon nitride, hydrogenated silicon nitride, silicon carbonitride, hydrogenated silicon carbonitride, boronitride, organic-inorganic composite materials, photoresists, organic polymers, porous organic and inorganic materials and composites, metal oxides such as aluminum oxide, and germanium oxide. Still further layers can also be germanosilicates, aluminosilicates, copper and aluminum, and diffusion barrier materials such as, but not limited to, TiN, Ti(C)N, TaN, Ta(C)N, Ta, W, or WN.

The deposition methods disclosed herein may involve one or more purge gases. The purge gas, which is used to purge away unconsumed reactants and/or reaction byproducts, is an inert gas that does not react with the precursors. Exemplary purge gases include, but are not limited to, argon (Ar), nitrogen (N2), helium (He), neon, hydrogen (H2), and mixtures thereof. In certain embodiments, a purge gas such as Ar is supplied into the reactor at a flow rate ranging from about 10 to about 2000 sccm for about 0.1 to 1000 seconds, thereby purging the unreacted material and any byproduct that may remain in the reactor.

A purge gas such as argon purges away unabsorbed excess complex from the process chamber. After sufficient purging, an oxygen source may be introduced into reaction chamber to react with the absorbed surface followed by another gas purge to remove reaction by-products from the chamber. The process cycle can be repeated to achieve the desired film thickness. In some cases, pumping can replace a purge with inert gas or both can be employed to remove unreacted silicon precursors.

Throughout the description, the term "ALD or ALD-like" refers to a process including, but not limited to, the following processes: a) each reactant including a silicon precursor and a reactive gas is introduced sequentially into a reactor such as a single wafer ALD reactor, semi-batch ALD reactor, or batch furnace ALD reactor; b) each reactant including the silicon precursor and the reactive gas is exposed to a substrate by moving or rotating the substrate to different sections of the reactor and each section is separated by inert gas curtain, i.e., spatial ALD reactor or roll to roll ALD reactor.

The method of the present invention is conducted via an ALD process that uses ozone, or an oxygen-containing source which comprises a plasma wherein the plasma can further comprise an inert gas such as one or more of the following: an oxygen plasma with or without inert gas, a water vapor plasma with or without inert gas, a nitrogen oxide (e.g., N2O, NO, NO2) plasma with or without inert gas, a carbon oxide (e.g., $CO_2$, CO) plasma with or without inert gas, and combinations thereof.

The oxygen-containing plasma source can be generated in situ or, alternatively, remotely. In one particular embodiment, the oxygen-containing source comprises oxygen and is flowing, or introduced during method steps b through d, along with other reagents such as without limitation, the at least one silicon precursor and optionally an inert gas.

In certain embodiments, the compositions described herein—and which are employed in the disclosed methods—further comprises a solvent. Exemplary solvents can include, without limitation, ether, tertiary amine, alkyl hydrocarbon, aromatic hydrocarbon, tertiary aminoether, and combinations thereof. In certain embodiments, the difference between the boiling point of the silicon precursor and the boiling point of the solvent is 40° C. or less. In some embodiments, the compositions can be delivered via direct liquid injection into a reactor chamber for silicon-containing film.

For those embodiments wherein at least one silicon precursor(s) having Formulae A-D is (are) used in a composition comprising a solvent, the solvent or mixture thereof selected does not react with the silicon precursor. The amount of solvent by weight percentage in the composition ranges from 0.5 wt % by weight to 99.5 wt % or from 10 wt % by weight to 75 wt %. In this or other embodiments, the solvent has a boiling point (b.p.) similar to the b.p. of the silicon precursor of Formulae A-D or the difference between the b.p. of the solvent and the b.p. of the silicon precursor of Formulae A-D is 40° C. or less, 30° C. or less, or 200 C or less, or 100 C. Alternatively, the difference between the boiling points ranges from any one or more of the following end-points: 0, 10, 20, 30, or 40° C. Examples of suitable ranges of b.p. difference include without limitation, 0 to 40° C., 20° to 30° C., or 10° to 30° C. Examples of suitable solvents in the compositions include, but are not limited to, an ether (such as 1,4-dioxane, dibutyl ether), a tertiary amine (such as pyridine, 1-methylpiperidine, 1-ethylpiperidine, N,N'-Dimethylpiperazine, N,N,N',N'-Tetramethylethylenediamine), a nitrile (such as benzonitrile), an alkyl hydrocarbon (such as octane, nonane, dodecane, ethylcyclohexane), an aromatic hydrocarbon (such as toluene, mesitylene), a tertiary aminoether (such as bis(2-dimethylaminoethyl) ether), or mixtures thereof.

In certain embodiments, silicon oxide or carbon doped silicon oxide films deposited using the methods described herein are formed in the presence of oxygen-containing source comprising ozone, water (H2O) (e.g., deionized water, purifier water, and/or distilled water), hydrogen peroxide (H2O2), oxygen (O2), oxygen plasma, NO, N2O, NO2, carbon monoxide (CO), carbon dioxide (CO2) and combinations thereof. The oxygen-containing source may be passed through, for example, either an in situ or remote plasma generator to provide oxygen-containing plasma source comprising oxygen such as an oxygen plasma, a plasma comprising oxygen and argon, a plasma comprising oxygen and helium, an ozone plasma, a water plasma, a nitrous oxide plasma, or a carbon dioxide plasma. In certain embodiments, the oxygen-containing plasma source comprises an oxygen source gas that is introduced into the reactor at a flow rate ranging from about 1 to about 2000 standard cubic centimeters (sccm) or from about 1 to about 1000 sccm. The oxygen-containing plasma source can be introduced for a time that ranges from about 0.1 to about 100 seconds. In one particular embodiment, the oxygen-containing plasma source comprises water having a temperature of 10° C. or greater. In embodiments wherein the film is deposited by a PEALD or a plasma enhanced cyclic CVD process, the precursor pulse can have a pulse duration that is greater than 0.01 seconds (e.g., about 0.01 to about 0.1 seconds, about 0.1 to about 0.5 seconds, about 0.5 to about 10 seconds, about 0.5 to about 20 seconds, about 1 to about 100 seconds) depending on the ALD reactor's volume, and the oxygen-containing plasma source can have a pulse duration that is less than 0.01 seconds (e.g., about 0.001 to about 0.01 seconds).

In one or more embodiments described above, the oxygen-containing plasma source is selected from the group consisting of oxygen plasma with or without inert gas water vapor plasma with or without inert gas, nitrogen oxides (N2O, NO, NO2) plasma with or without inert gas, carbon oxides (CO2, CO) plasma with or without inert gas, and combinations thereof. In certain embodiments, the oxygen-containing plasma source further comprises an inert gas. In these embodiments, the inert gas is selected from the group consisting of argon, helium, nitrogen, hydrogen, or combinations thereof. In an alternative embodiment, the oxygen-containing plasma source does not comprise an inert gas.

The respective step of supplying the precursors, oxygen source, and/or other precursors, source gases, and/or reagents may be performed by changing the time for supplying them to change the stoichiometric composition of the resulting dielectric film.

Energy is applied to the at least one of the silicon precursors of Formulae A-D, oxygen containing source, or combination thereof to induce reaction and to form the dielectric film or coating on the substrate. Such energy can be provided by, but not limited to, thermal, plasma, pulsed plasma, helicon plasma, high density plasma, inductively coupled plasma, X-ray, e-beam, photon, remote plasma methods, and combinations thereof. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively, a remote plasma-generated process in which plasma is generated outside of the reactor and supplied into the reactor.

The at least one silicon precursor may be delivered to the reaction chamber such as a plasma enhanced cyclic CVD or PEALD reactor or a batch furnace type reactor in a variety of ways. In one embodiment, a liquid delivery system may be utilized. In an alternative embodiment, a combined liquid delivery and flash vaporization process unit may be employed, such as, for example, the turbo vaporizer manufactured by MSP Corporation of Shoreview, MN, to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

As previously mentioned, the purity level of the at least one silicon precursor is sufficiently high enough to be acceptable for reliable semiconductor manufacturing. In certain embodiments, the at least one silicon precursor described herein comprise less than 2% by weight, or less than 1% by weight, or less than 0.5% by weight of one or more of the following impurities: free amines, free halides or halogen ions, and higher molecular weight species. Higher purity levels of the silicon precursor described herein can be obtained through one or more of the following processes: purification, adsorption, and/or distillation.

In one embodiment of the method described herein, a plasma enhanced cyclic deposition process such as PEALD-like or PEALD may be used wherein the deposition is conducted using the at least one silicon precursor and an oxygen plasma source. The PEALD-like process is defined as a plasma enhanced cyclic CVD process but still provides high conformal silicon and oxygen-containing films.

In one embodiment of the present invention, a method is described herein for depositing a silicon and oxygen containing film on at least one surface of a substrate, wherein the method comprises the steps of:
 a. providing a substrate in a reactor;
 b. introducing into the reactor at least one silicon precursor having Formulae A-D as defined above;
 c. purging the reactor with purge gas;
 d. introducing oxygen-containing source comprising a plasma into the reactor; and
 e. purging the reactor with a purge gas.

In this method, steps b through e are repeated until a desired thickness of film is deposited on the substrate.

In this or other embodiments, it is understood that the steps of the methods described herein may be performed in a variety of orders, may be performed sequentially, may be performed concurrently (e.g., during at least a portion of another step), and any combination thereof. The respective step of supplying the precursors and the oxygen source gases, for example, may be performed by varying the duration of the time for supplying them to change the stoichiometric composition of the resulting dielectric film. Also, purge times after precursor or oxidant steps can be minimized to <0.1 s so that throughput is improved.

In one particular embodiment, the method described herein deposits a high quality silicon and oxygen containing film on a substrate. The method comprises the following steps:
 a. providing a substrate in a reactor;
 b. introducing into the reactor at least one silicon precursor having the Formulae A-D described herein;
 c. purging reactor with purge gas to remove at least a portion of the unabsorbed precursors;
 d. introducing an oxygen-containing plasma source into the reactor and
 e. purging reactor with purge gas to remove at least a portion of the unreacted oxygen source,
wherein steps b through e are repeated until a desired thickness of the silicon-containing film is deposited.

In another particular embodiment, the method described herein deposits a high quality silicon and oxygen containing film on a substrate at temperatures greater than 600° C. The method comprises the following steps:
 a. providing a substrate in a reactor;
 b. introducing into the reactor at least one silicon precursor having the Formulae A-D described herein;
 c. purging reactor with purge gas to remove at least a portion of the unabsorbed precursors;
 d. introducing an oxygen-containing plasma source into the reactor and
 e. purging reactor with purge gas to remove at least a portion of the unreacted oxygen source,
wherein steps b through e are repeated until a desired thickness of the silicon-containing film is deposited.

It is believed that organoamino-functionalized cyclic oligosiloxane precursors having Formulae A-D, especially wherein R3-R9 are not hydrogen, are preferred for this method because they either do not comprise any Si—H groups, or the number of Si—H groups are limited, since Si—H groups can decompose at temperatures higher than 600° C. and can potentially cause undesired chemical vapor deposition. However, it is possible that under certain conditions, such as using short precursor pulses or low reactor pressures, this method can also be carried out using organoamino-functionalized cyclic oligosiloxane precursors having Formulae A-D, wherein any of R3-9 are hydrogen, at temperatures above 600° C. without significant undesirable chemical vapor deposition.

Another method disclosed herein forms a carbon doped silicon oxide film using a silicon precursor compound having the chemical structure represented by Formulae A-D as defined above plus an oxygen source.

Another exemplary process is described as follows:
 a. providing a substrate in a reactor;
 b. contacting vapors generated from at least one silicon precursor compound having a structure represented by Formulae A-D as defined above, with or without co-flowing an oxygen source to chemically absorb the precursors on the heated substrate;
 c. purging away any unabsorbed precursors;
 d. Introducing an oxygen source on the heated substrate to react with the absorbed precursors; and,
 e. purging away any unreacted oxygen source,
wherein steps b through e are repeated until a desired thickness is achieved.

In another particular embodiment, the method described herein deposits a high quality silicon oxynitride film, on a substrate. The method comprises the following steps:
 a. providing a substrate in a reactor;
 b. introducing into the reactor at least one silicon precursor having the Formulae A-D described herein;
 c. purging reactor with purge gas to remove at least a portion of the unabsorbed precursors;
 d. introducing a nitrogen-containing plasma source into the reactor and
 e. purging reactor with purge gas to remove at least a portion of the unreacted nitrogen source,
wherein steps b through e are repeated until a desired thickness of the silicon oxynitride containing film is deposited.

Another exemplary process is described as follows:
 a. providing a substrate in a reactor;
 b. contacting vapors generated from at least one silicon precursor compound having a structure represented by Formulae A-D as defined above, with or without co-flowing a nitrogen source to chemically absorb the precursors on the heated substrate;
 c. purging away any unabsorbed precursors;
 d. Introducing a nitrogen source on the heated substrate to react with the absorbed precursors; and,
 e. purging away any unreacted nitrogen source,
wherein steps b through e are repeated until a desired thickness is achieved.

Various commercial ALD reactors such as single wafer, semi-batch, batch furnace or roll to roll reactor can be employed for depositing the solid silicon oxide, silicon oxynitride, carbon doped silicon oxynitride, or carbon doped silicon oxide.

Process temperature for the method described herein use one or more of the following temperatures as endpoints: 0° C., 25° C., 50° C., 75° C., 100° C., 125° C., 150° C., 175° C., 200° C., 225° C., 250° C., 275° C., 300° C., 325° C., 350° C., 375° C., 400° C., 425° C., 450° C., 475° C., 500° C., 525° C., 550° C., 575° C., 600° C., 625° C., 650° C., 675° C., 700° C., 725° C., 750° C., 775° C., and 800° C. Exemplary temperature ranges include, but are not limited to the following: from about 0° C. to about 300° C.; or from about 25° C. to about 300° C.; or from about 50° C. to about 290° C.; or from about 25° C. to about 250° C., or from about 25° C. to about 200° C.

In another aspect, there is provided a method for depositing a silicon and oxygen containing film via flowable chemical vapor deposition (FCVD), the method comprising:
   placing a substrate comprising a surface feature into a reactor wherein the substrate is maintained at one or more temperatures ranging from about −20° C. to about 400° C. and a pressure of the reactor is maintained at 100 torr or less;
   introducing at least one compound selected from the group consisting of Formulae A-D as defined herein;
   providing an oxygen source into the reactor to react with the at least one compound to form a film and cover at least a portion of the surface feature;
   annealing the film at one or more temperatures of about 100° C. to 1000° C. to coat at least a portion of the surface feature; and
   treating the substrate with an oxygen source at one or more temperatures ranging from about 20° C. to about 1000° C. to form the silicon-containing film on at least a portion of the surface feature.

In another aspect, there is provided a method for depositing a silicon and oxygen containing film via flowable chemical vapor deposition (FCVD), the method comprising:
   placing a substrate comprising a surface feature into a reactor wherein the substrate is maintained at one or more temperatures ranging from about −20° C. to about 400° C. and a pressure of the reactor is maintained at 100 torr or less;
   introducing at least one compound selected from the group consisting of Formulae A-D as defined herein;
   providing a nitrogen and/or oxygen source into the reactor to react with the at least one compound to form a film and cover at least a portion of the surface feature;
   annealing the film at one or more temperatures of about 100° C. to 1000° C. to coat at least a portion of the surface feature; and
   treating the substrate with an oxygen source at one or more temperatures ranging from about 20° C. to about 1000° C. to form the silicon-containing film on at least a portion of the surface feature.

In certain embodiments, the oxygen source is selected from the group consisting of water vapors, water plasma, ozone, oxygen, oxygen plasma, oxygen/helium plasma, oxygen/argon plasma, nitrogen oxides plasma, carbon dioxide plasma, hydrogen peroxide, organic peroxides, and mixtures thereof. In other embodiments, the nitrogen source is selected from the group consisting of for example, ammonia, hydrazine, monoalkylhydrazine, dialkylhydrazine, nitrogen, nitrogen/hydrogen, nitrogen/argon plasma, nitrogen/helium plasma, ammonia plasma, nitrogen plasma, nitrogen/hydrogen plasma, organic amines such as tert-butylamine, dimethylamine, diethylamine, isopropylamine, diethylamine plasma, dimethylamine plasma, trimethyl plasma, trimethylamine plasma, ethylenediamine plasma, and an alkoxyamine such as ethanolamine plasma, and mixtures thereof. In yet other embodiments, the nitrogen-containing source comprises an ammonia plasma, a plasma comprising nitrogen and argon, a plasma comprising nitrogen and helium or a plasma comprising hydrogen and nitrogen source gas. In this or other embodiments, the method steps are repeated until the surface features are filled with the silicon-containing film. In embodiments wherein water vapor is employed as an oxygen source in flowable chemical vapor deposition processes, the substrate temperature ranges from about −20° C. to about 40° C. or from about −10° C. to about 25° C.

In a still further embodiment of the method described herein, the film or the as-deposited film deposited from ALD, ALD-like, PEALD, PEALD-like or FCVD is subjected to a treatment step (post deposition). The treatment step can be conducted during at least a portion of the deposition step, after the deposition step, and combinations thereof. Exemplary treatment steps include, without limitation, treatment via high temperature thermal annealing; plasma treatment; ultraviolet (UV) light treatment; laser; electron beam treatment and combinations thereof to affect one or more properties of the film.

In another embodiment, a vessel or container for depositing a silicon-containing film comprising one or more silicon precursor compounds is described herein. In one particular embodiment, the vessel comprises at least one pressurizable vessel (preferably of stainless steel having a design such as disclosed in U.S. Pat. Nos. U.S. Pat. Nos. 7,334,595; 6,077,356; 5,069,244; and 5,465,766 the disclosure of which is hereby incorporated by reference. The container can comprise either glass (borosilicate or quartz glass) or type 316, 316L, 304 or 304L stainless steel alloys (UNS designation S31600, S31603, S30400 S30403) fitted with the proper valves and fittings to allow the delivery of one or more precursors to the reactor for a CVD or an ALD process. In this or other embodiments, the silicon precursor is provided in a pressurizable vessel comprised of stainless steel and the purity of the precursor is 98% by weight or greater or 99.5% or greater which is suitable for the majority of semiconductor applications. The head-space of the vessel or container is filled with inert gases selected from helium, argon, nitrogen and combination thereof.

In certain embodiments, the gas lines connecting from the precursor canisters to the reaction chamber are heated to one or more temperatures depending upon the process requirements and the container of the at least one silicon precursor is kept at one or more temperatures for bubbling. In other embodiments, a solution comprising the at least one silicon precursor is injected into a vaporizer kept at one or more temperatures for direct liquid injection.

A flow of argon and/or other gas may be employed as a carrier gas to help deliver the vapor of the at least one silicon precursor to the reaction chamber during the precursor pulsing. In certain embodiments, the reaction chamber process pressure is about 50 mTorr to 10 Torr. In other embodiments, the reaction chamber process pressure can be up to 760 Torr (e.g., about 50 mtorr to about 100 Torr).

In a typical PEALD or a PEALD-like process such as a PECCVD process, the substrate such as a silicon oxide substrate is heated on a heater stage in a reaction chamber that is exposed to the silicon precursor initially to allow the complex to chemically adsorb onto the surface of the substrate.

The films deposited with the silicon precursors having Formulae A-D described herein, when compared to films deposited with previously disclosed silicon precursors under the same conditions, have improved properties such as, without limitation, a wet etch rate that is lower than the wet etch rate of the film before the treatment step or a density that is higher than the density prior to the treatment step. In one particular embodiment, during the deposition process, as-deposited films are intermittently treated. These intermittent or mid-deposition treatments can be performed, for example, after each ALD cycle, after every a certain number of ALD cycles, such as, without limitation, one (1) ALD cycle, two (2) ALD cycles, five (5) ALD cycles, or after every ten (10) or more ALD cycles.

The precursors of Formulae A-D exhibit a growth rate of 2.0 Å/cycle or greater.

In an embodiment wherein the film is treated with a high temperature annealing step, the annealing temperature is at least 100° C. or greater than the deposition temperature. In this or other embodiments, the annealing temperature ranges from about 400° C. to about 1000° C. In this or other embodiments, the annealing treatment can be conducted in a vacuum (<760 Torr), inert environment or in oxygen containing environment (such as H2O, N2O, NO2, O2, or ambient air).

In an embodiment wherein the film is treated to UV treatment, film is exposed to broad band UV or, alternatively, an UV source having a wavelength ranging from about 150 nanometers (nm) to about 400 nm. In one particular embodiment, the as-deposited film is exposed to UV in a different chamber than the deposition chamber after a desired film thickness is reached.

In an embodiment where in the film is treated with a plasma, passivation layer such as SiO2 or carbon doped SiO2 is deposited to prevent chlorine and nitrogen contamination to penetrate into film in the subsequent plasma treatment. The passivation layer can be deposited using atomic layer deposition or cyclic chemical vapor deposition.

In an embodiment wherein the film is treated with a plasma, the plasma source is selected from the group consisting of hydrogen plasma, plasma comprising hydrogen and helium, plasma comprising hydrogen and argon. Hydrogen plasma lowers film dielectric constant and boost the damage resistance to following plasma ashing process while still keeping the carbon content in the bulk almost unchanged.

Without intending to be bound by a particular theory, it is believed that the silicon precursor compound having a chemical structure represented by Formulae A-D as defined above can be anchored via reacting the at least one organoamino group with hydroxyl on substrate surface to provide multiple Si—O—Si fragments per molecule of precursor, thus boosting the growth rate of silicon oxide or carbon doped silicon oxide compared to conventional silicon precursors such as bis(tert-butylamino)silane or bis(diethylamino)silane having only one silicon atom. It is possible that silicon compounds having Formulae A-D which have two or more organoamino groups may be able to react with two or more neighboring hydroxyl group on the surface of a substrate, which may improve the final film properties. It is also believed that organoamino-functionalized cyclic oligosiloxanes disclosed herein will exhibit higher growth per cycle (GPC) values as the number of silicon atoms is increased. For example, it may be possible to achieve a higher GPC if 2-dimethylamino-2,4,6,8,10-pentamethylcyclopentasiloxane (5 silicon atoms) is used as a silicon ALD precursor compared to 2-dimethylamino-2,4,6,8-tetramethylcyclotetrasiloxane (4 silicon atoms).

Without intending to be bound by a particular theory, it is believed that functionalizing the cyclic oligosiloxane molecules such as 2,4,6-trimethylcyclotrisiloxane, 2,4,6,8-tetramethylcyclotetrasiloxane, and 2,4,6,8,10-pentamethylcyclopentasiloxane and other cyclic oligosiloxanes with an organoamino group can increase the thermal stability of the cyclic oligosiloxane, giving it a longer shelf life and maintaining a high purity for longer periods of time by inhibiting decomposition. In some cases, more organoamino groups can provide even higher thermal stability to the molecule. For certain applications, the improved stability of the silicon precursors described herein having Formulae A-D make them superior to the parent cyclic oligosiloxane precursors.

Without intending to be bound by a particular theory, it is believed that functionalizing the cyclic oligosiloxane molecules such as 2,4,6-trimethylcyclotrisiloxane, 2,4,6,8-tetramethylcyclotetrasiloxane, and 2,4,6,8,10-pentamethylcyclopentasiloxane and other cyclic oligosiloxanes with multiple organoamino groups can provide a precursor that results in a greater level of networking in the resulting silicon-containing film, especially when the oxygen-containing reactant in the deposition process is a mild oxidant such as water or hydrogen peroxide.

In certain embodiments, the silicon precursors having Formulae A-D as defined above can also be used as a dopant for metal containing films, such as but not limited to, metal oxide films or metal oxynitride films. In these embodiments, the metal containing film is deposited using an ALD or CVD process such as those processes described herein using metal alkoxide, metal amide, or volatile organometallic precursors. Examples of suitable metal alkoxide precursors that may be used with the method disclosed herein include, but are not limited to, group 3 to 6 metal alkoxide, group 3 to 6 metal complexes having both alkoxy and alkyl substituted cyclopentadienyl ligands, group 3 to 6 metal complexes having both alkoxy and alkyl substituted pyrrolyl ligands, group 3 to 6 metal complexes having both alkoxy and diketonate ligands; group 3 to 6 metal complexes having both alkoxy and ketoester ligands.

Examples of suitable metal amide precursors that may be used with the method disclosed herein include, but are not limited to, tetrakis(dimethylamino)zirconium (TDMAZ), tetrakis(diethylamino)zirconium (TDEAZ), tetrakis(ethylmethylamino)zirconium (TEMAZ), tetrakis(dimethylamino)hafnium (TDMAH), tetrakis(diethylamino)hafnium (TDEAH), and tetrakis(ethylmethylamino)hafnium (TEMAH), tetrakis(dimethylamino)titanium (TDMAT), tetrakis(diethylamino)titanium (TDEAT), tetrakis(ethylmethylamino)titanium (TEMAT), tert-butylimino tri(diethylamino)tantalum (TBTDET), tert-butylimino tri(dimethylamino)tantalum (TBTDMT), tert-butylimino tri(ethylmethylamino)tantalum (TBTEMT), ethylimino tri(diethylamino)tantalum (EITDET), ethylimino tri(dimethylamino)tantalum (EITDMT), ethylimino tri(ethylmethylamino)tantalum (EITEMT), tert-amylimino tri(dimethylamino)tantalum (TAIMAT), tert-amylimino tri(diethylamino)tantalum, pentakis(dimethylamino)tantalum, tert-amylimino tri(ethylmethylamino)tantalum, bis(tert-butylimino)bis(dimethylamino)tungsten (BTBMW), bis(tert-butylimino)bis(diethylamino)tungsten, bis(tert-butylimino)bis(ethylmethylamino)tungsten, and combinations thereof. Examples of suitable organometallic precursors that may be used with the method disclosed herein include, but are not limited to, group 3 metal cyclopentadienyls or alkyl cyclopentadienyls. Exemplary Group 3 to 6 metals herein include, but not limited to, Y, La, Ce, Pr, Nd, Sm, Eu, Gd, Tb, Dy, Er, Yb, Lu, Ti, Hf, Zr, V, Nb, Ta, Cr, Mo, and W.

In certain embodiments, the silicon-containing films described herein have a dielectric constant of 6 or less, 5 or less, 4 or less, and 3 or less. In these or other embodiments, the films can a dielectric constant of about 5 or below, or about 4 or below, or about 3.5 or below. However, it is envisioned that films having other dielectric constants (e.g., higher or lower) can be formed depending upon the desired end-use of the film. An example of silicon-containing film that is formed using the silicon precursors having Formulae A-D and processes described herein has the formulation $Si_xO_yC_zN_vH_w$ wherein Si ranges from about 10% to about 40%; O ranges from about 0% to about 65%; C ranges from about 0% to about 75% or from about 0% to about 50%; N ranges from about 0% to about 75% or from about 0% to 50%; and H ranges from about 0% to about 50% atomic percent weight % wherein x+y+z+v+w=100 atomic weight percent, as determined for example, by XPS or other means. Another example of the silicon containing film that is formed using the silicon precursors of Formulae A-D and processes described herein is silicon carbo-oxynitride wherein the carbon content is from 1 at % to 80 at % measured by XPS. In yet, another example of the silicon containing film that is formed using the silicon precursors having Formulae A-D and processes described herein is amorphous silicon wherein both sum of nitrogen and carbon contents is <10 at %, preferably <5 at %, most preferably <1 at % measured by XPS.

As mentioned previously, the method described herein may be used to deposit a silicon-containing film on at least a portion of a substrate. Examples of suitable substrates include but are not limited to, silicon, SiO2, Si3N4, OSG, FSG, silicon carbide, hydrogenated silicon oxycarbide, hydrogenated silicon oxynitride, silicon carbo-oxynitride, hydrogenated silicon carbo-oxynitride, antireflective coatings, photoresists, germanium, germanium-containing, boron-containing, Ga/As, a flexible substrate, organic polymers, porous organic and inorganic materials, metals such as copper and aluminum, and diffusion barrier layers such as but not limited to TiN, Ti(C)N, TaN, Ta(C)N, Ta, W, or WN. The films are compatible with a variety of subsequent processing steps such as, for example, chemical mechanical planarization (CMP) and anisotropic etching processes.

The deposited films have applications, which include, but are not limited to, computer chips, optical devices, magnetic information storages, coatings on a supporting material or substrate, microelectromechanical systems (MEMS), nano-electromechanical systems, thin film transistor (TFT), light emitting diodes (LED), organic light emitting diodes (OLED), IGZO, and liquid crystal displays (LCD). Potential use of resulting solid silicon oxide or carbon doped silicon oxide include, but not limited to, shallow trench insulation, inter layer dielectric, passivation layer, an etch stop layer, part of a dual spacer, and sacrificial layer for patterning.

The methods described herein provide a high quality silicon oxide, silicon oxynitride, carbon doped silicon oxynitride, or carbon-doped silicon oxide film. The term "high quality" means a film that exhibits one or more of the following characteristics: a density of about 2.1 g/cc or greater, 2.2 g/cc or greater, 2.25 g/cc or greater; a wet etch rate that is 2.5 Å/s or less, 2.0 Å/s or less, 1.5 Å/s or less, 1.0 Å/s or less, 0.5 Å/s or less, 0.1 Å/s or less, 0.05 Å/s or less, 0.01 Å/s or less as measured in a solution of 1:100 of HF to water dilute HF (0.5 wt % dHF) acid, an electrical leakage of about 1 or less e-8 Å/cm2 up to 6 MV/cm); a hydrogen impurity of about 5 e20 at/cc or less as measured by SIMS; and combinations thereof. With regard to the etch rate, a thermally grown silicon oxide film has 0.5 Å/s etch rate in 0.5 wt % HF.

In certain embodiments, one or more silicon precursors having Formulae A-D described herein can be used to form silicon and oxygen containing films that are solid and are non-porous or are substantially free of pores.

The following Examples are provided to illustrate certain aspects of the invention and shall not limit the scope of the appended claims.

Working Examples

Example 1a. Synthesis of 2,4-bis(dimethylamino)-2, 4,6,8-tetramethylcyclotetrasiloxane and 2,6-bis(dimethylamino)-2,4,6,8-tetramethylcyclotetrasiloxane To a stirring solution of THF (200 mL), Ru3(CO)12 (1.12 g, 0.00175 mol, 2.2 mol %) and 2,4,6,8-tetramethylcyclotetrasiloxane (192 g, 0.792 mol) at room temperature was added dimethylamine solution in THF (396 mL 2.0 M solution, 2 equiv.) dropwise over 4 hours at room temperature. The reaction solution was continued to stir at room temperature overnight. The solvent was removed under reduced pressure and the crude product was purified by fractional distillation (6 Torr/94° C.) to afford a mixture of 2,4-bis(dimethylamino)-2,4,6,8-tetramethylcyclotetrasiloxane and 2,6-bis(dimethylamino)-2,4,6,8-tetramethylcyclotetrasiloxane. GC-MS showed the following peaks for both compounds: 326 (M+), 311 (M-15), 282, 266, 252, 239, 225, 209, 193, 179, 165, 149, 141, 133, 119,111, 104, 89, 73, 58, 44.

Example 1b. Thermal Stability of Bis(dimethylamino)-2,4,6,8-tetramethylcyclotetrasiloxane Several purified samples of bis(dimethylamino)-2,4,6,8-tetramethylcyclotetrasiloxane (mixture of isomers), were heated at 80° C. for 7 days. The assay of bis(dimethylamino)-2,4,6,8-tetramethylcyclotetrasiloxane as determined by GC analysis dropped from 96.47% to an average value of 96.37%, demonstrating that bis(dimethylamino)-2,4,6,8-tetramethylcyclotetrasiloxane has excellent thermal stability and is suitable as precursor for vapor deposition processes.

Example 2. Synthesis of 2,4-bis(diethylamino)-2,4, 6,8-tetramethylcyclotetrasiloxane and 2,6-bis(diethylamino)-2,4,6,8-tetramethylcyclotetrasiloxane A similar procedure was followed as in Example 1, except that diethylamine was used instead of dimethylamine to afford a mixture of 2,4-bis(diethylamino)-2,4,6,8-tetramethylcyclotetrasiloxane and 2,6-bis(diethylamino)-2,4,6,8-tetramethylcyclotetrasiloxane. GC-MS showed the following peaks for both compounds: m/z=382 (M+), 367 (M-15), 353, 340, 326, 310, 296, 280, 266, 252, 239, 225, 207, 193, 179, 165, 147, 133, 119, 111, 104, 86, 72, 59, 42.

Example 3. Synthesis of 2,4-bis(N-ethylmethylamino)-2,4,6,8-tetramethylcyclotetrasiloxane and 2,6-bis(N-ethylmethylamino)-2,4,6,8-tetramethylcyclotetrasiloxane A similar procedure was followed as in Example 1, except that N-ethylmethylamine was used instead of dimethylamine to afford a mixture of 2,4-bis(N-ethylmethylamino)-2,4,6,8-tetramethylcyclotetrasiloxane and 2,6-bis(N-ethylmethylamino)-2,4,6,8-tetramethylcyclotetrasiloxane. GC-MS showed the following peaks for both compounds: m/z=355 (M+), 340 (M-15), 324, 312, 297, 283, 267, 253, 240, 226, 194, 179, 163, 141, 133, 119, 111, 103, 89, 73, 58, 44.

Example 4. Synthesis of 2,4-bis(iso-propylamino)-2,4,6,8-tetramethylcyclotetrasiloxane and 2,6-bis(iso-propylamino)-2,4,6,8-tetramethylcyclotetrasiloxane A similar procedure was followed as in Example 1, except that iso-propylamine was used instead of dimethylamine to afford a mixture of 2,4-bis(iso-propylamino)-2,4,6,8-tetramethylcyclotetrasiloxane and 2,6-bis(N-iso-propylamino)-2,4,6,8-tetramethylcyclotetrasiloxane. GC-MS showed the following peaks for both compounds: m/z=356 (M+), 341 (M-15), 325, 313, 296, 282, 253, 240, 223, 208, 193, 180, 164, 150, 141, 134, 120, 112, 103, 87, 74, 59, 44.

Example 5. Synthesis of 2,4-bis(methylamino)-2,4,6,8-tetramethylcyclotetrasiloxane and 2,6-bis(methylamino)-2,4,6,8-tetramethylcyclotetrasiloxane A similar procedure was followed as in Example 1, except that methylamine was used instead of dimethylamine to afford a mixture of 2,4-bis(methylamino)-2,4,6,8-tetramethylcyclotetrasiloxane and 2,6-bis(methylamino)-2,4,6,8-tetramethylcyclotetrasiloxane. GC-MS showed the following peaks for both compounds: m/z=298 (M+), 283 (M-15), 268, 252, 239, 225, 209, 193, 179, 165, 149, 135, 127,119, 112, 104, 97, 89, 75, 59, 44.

Example 6a. Synthesis of 2-dimethylamino-2,4,6,8,10-pentamethylcyclopentasiloxane To a stirring solution of THF (200 mL), $Ru_3(CO)_{12}$ (1.12 g, 0.00172 mol) and 2,4,6,8,10-pentamethylcyclopentasiloxane (240 g, 0.798 mol) at room temperature was added dimethylamine solution in THF (176 mL, 2.0 M solution) over 4 hours under the protection of nitrogen. The reaction solution was continued to stir at room temperature overnight. The solvent was removed under reduced pressure and the crude product was purified by fractional distillation (1.5 Torr/60° C.) to afford the desired product, 2-dimethylamino-2,4,6,8,10-pentamethylcyclopentasiloxane, as a colorless liquid. GC-MS showed the following mass peaks: m/z=344 (M+), 329 (M-15), 313, 300, 286, 268, 254, 240, 226, 210, 193, 179, 165, 149, 134, 119, 102, 88, 73, 59, 45.

Example 6b. Thermal Stability of 2-dimethylamino-2,4,6,8,10-pentamethylcyclopentasiloxane Several purified samples of 2-dimethylamino-2,4,6,8,10-pentamethylcyclopentasiloxane were heated at 80° C. for 7 days. The assay of 2-dimethylamino-2,4,6,8,10-pentamethylcyclopentasiloxane as determined by GC analysis dropped from 97.57% to an average value of 97.23%, demonstrating that of 2-dimethylamino-2,4,6,8,10-pentamethylcyclopentasiloxane has excellent thermal stability and is suitable as precursor for vapor deposition processes.

Example 7. Synthesis of 2-diethylamino-2,4,6,8,10-pentamethylcyclopentasiloxane

To a stirring solution of THF (1 mL), $Ru_3(CO)_{12}$ (0.010 g, 0.000016 mol) and 2,4,6,8,10-pentamethylcyclopentasiloxane (1.0 g, 0.0033 mol) at room temperature was added diethylamine (0.22 g, 0.0030 mol) under the protection of nitrogen. The reaction solution was continued to stir at room temperature overnight. The solution was determined by GC-MS to contain 2-diethylamino-2,4,6,8,10-pentamethylcyclopentasiloxane as the major product. GC-MS showed the following mass peaks: m/z=371 (M+), 357, 341, 327, 311, 300, 286, 268, 254, 240, 226, 210, 193, 179, 165, 149, 133, 116, 102, 86, 73, 59, 45.

Example 8. Synthesis of 2-(N-ethylmethylamino)-2,4,6,8,10-pentamethylcyclopentasiloxane To a stirring solution of THF (1 mL), $Ru_3(CO)_{12}$ (0.010 g, 0.000016 mol) and 2,4,6,8,10-pentamethylcyclopentasiloxane (1.0 g, 0.0033 mol) at room temperature was added N-ethylmethylamine (0.17 g, 0.0029 mol) under the protection of nitrogen. The reaction solution was continued to stir at room temperature overnight. The solution was determined by GC-MS to contain 2-(N-ethylmethylamino)-2,4,6,8,10-pentamethylcyclopentasiloxane as the major product. GC-MS showed the following mass peaks: m/z=357 (M+), 343, 327, 316, 300, 283, 273, 253, 239, 225, 209, 193, 179, 165, 149, 135,116, 102, 88, 73, 59, 45.

Example 9. Synthesis of 2,4,6,8-tetrakis(methylamino)-2,4,6,8-tetramethylcyclotetrasiloxane from 2,4,6,8-tetrachloro-2,4,6,8-tetramethylcyclotetrasiloxane and methylamine A solution of methylamine in THF (3.0 mL, 2.0 M solution) was diluted with hexanes (3 mL) and stirred. To this solution was added 2,4,6,8-tetrachloro-2,4,6,8-tetramethylcyclotetrasiloxane solids (0.20 g, 0.000529 mol) slowly over 10 minutes, during which a white precipitate formed. After stirring the reaction mixture for 30 minutes, the white solids were removed via filtration, and the filtrate concentrated under reduced pressure. The resulting oily residue produced colorless crystals of the product, 2,4,6,8-tetrakis(methylamino)-2,4,6,8-tetramethylcyclotetrasiloxane, upon standing at room temperature. GC-MS showed the following mass peaks: 355 (M+), 340 (M-15), 326, 311, 296, 282, 267, 253, 240, 225, 209, 193, 179, 165, 147, 133, 120,112, 105, 94, 82, 73, 59, 44.

Example 10. Synthesis of 2,4,6,8-tetrakis(methylamino)-2,4,6,8-tetramethylcyclotetrasiloxane from 2,4,6,8-tetramethylcyclotetrasiloxane and methylamine (prophetic)

To a stirring solution of $Rus(CO)_{12}$ (1.33 g, 0.00208 mol) and methylamine solution in THF (1.04 L, 2.0 M solution) is added dropwise 2,4,6,8-tetramethylcyclotetrasiloxane (100 g, 0.417 mol) at room temperature over 4 hours. The reaction solution is continued to stir at room temperature overnight. The solvent is removed under reduced pressure and the crude product is purified by fractional distillation to afford the desired product, 2,4,6,8-tetrakis(methylamino)-2,4,6,8-tetramethylcyclotetrasiloxane.

Example 11. Synthesis of 2,4,6,8-tetrakis(dimethylamino)-2,4,6,8-tetramethylcyclotetrasiloxane from 2,4,6,8-tetrachloro-2,4,6,8-tetrachloro-2,4,6,8-tetramethylcyclotetrasiloxane and dimethylamine A solution of dimethylamine in THF (3.0 mL, 2.0 M solution) was diluted with hexanes (3 mL) and stirred. To this solution was added 2,4,6,8-tetrachloro-2,4,6,8-tetramethylcyclotetrasiloxane solids (0.20 g, 0.000529 mol) slowly over 10 minutes, during which a white precipitate formed. After stirring the reaction mixture for 30 minutes, the white solids were removed via filtration, and the filtrate concentrated under reduced pressure. The resulting oily residue was determined by GC-MS to contain 2,4,6,8-tetrakis(methylamino)-2,4,6,8-tetramethylcyclotetrasiloxane as the sole product. GC-MS showed the following mass peaks: 413 (M+), 398 (M-15), 384, 369, 355, 339, 326, 310, 296, 283, 267, 253, 240, 225, 209, 194, 179, 163, 155, 141, 134, 119, 111, 103, 89, 73, 58, 44.

Example 12. PEALD Silicon Oxide Using bis(dimethylamino)-2,4,6,8-Tetramethylcyclotetrasiloxane (Comprising a Mixture of 2,4- and 2,6-Isomers) in Laminar Flow Reactor with 27.1 MHz Plasma Plasma enhanced ALD (PEALD) was performed on a commercial lateral flow reactor (300 mm PEALD tool manufactured by ASM) equipped with 27.1 MHz direct plasma capability with 3.5 mm fixed spacing between electrodes. Precursors were liquids heated up to 62° C. in stainless steel bubblers and delivered to the chamber with Ar carrier gas. All depositions reported in this study were done on native oxide containing Si substrates. Thickness and refractive indices of the films were measured using a FilmTek 2000SE ellipsometer. Wet etch rate (WER) measurements were performed by using 1:99 (0.5 wt. %) diluted hydrofluoric (HF) acid solution. Thermal oxide wafers were used as standard for each set of experiments to confirm the etch solution's activity. The samples were all etched for 15 seconds to remove any surface layer before starting to collect the bulk film's WER. A typical thermal oxide wafer wet etch rate for 1:99 (0.5 wt. %) dHF water solution was 0.5 Å/s by this procedure.

Depositions were performed with bis(dimethylamino)-2,4,6,8-tetramethylcyclotetrasiloxane (comprising a mixture of 2,4- and 2,6-isomers) as the silicon precursor and O2 plasma under conditions as described above in Table 2. The silicon precursor was delivered to chamber with carrier gas Ar flow of 200 sccm. Steps b to e were repeated many times to get a desired thickness of silicon oxide for metrology.

TABLE 2

Process for PEALD Silicon Oxide Deposition in the Commercial Lateral Flow PEALD Reactor with bis(dimethylamino)-2,4,6,8-tetramethylcyclotetrasiloxane

| Step | | |
|---|---|---|
| a | Introduce Si wafer to the reactor | Deposition temperature = 100° or 300° C. |
| b | Introduce silicon precursor to the reactor | Carrier gas precursor delivery = variable seconds with 200 sccm Ar; Process gas Argon flow = 300 sccm Reactor pressure = 2 or 3 Torr |
| c | Purge silicon precursor with inert gas (argon) | Argon flow = 300 sccm Reactor pressure = 2 or 3 Torr |
| d | Oxidation using plasma | Argon flow = 300 sccm Oxygen flow = 100 sccm Plasma power = variable W Plasma time = variable seconds Reactor pressure = 2 or 3 Torr |
| e | Purge O2 plasma | Plasma off Argon flow = 300 sccm Argon flow time = 5 seconds Reactor pressure = 2 or 3 Torr |

Figure 2:
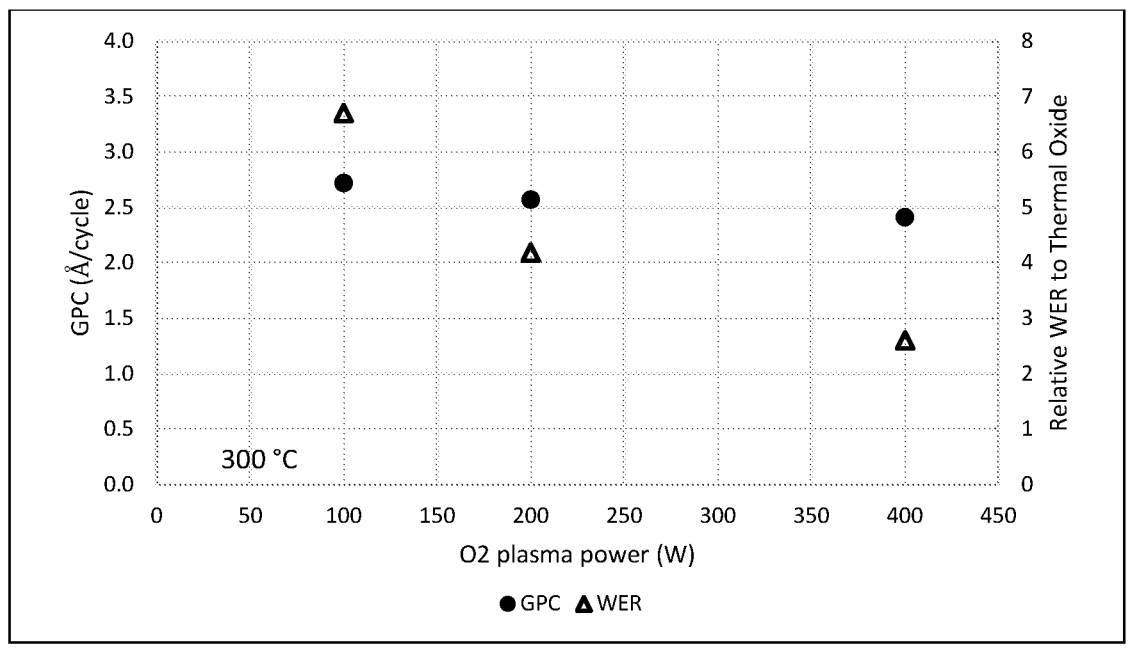
FIG. 2 shows the film GPC and WER versus O2 plasma power using bis(dimethylamino)-2,4,6,8-tetramethylcyclotetrasiloxane at 300° C. deposition according to the present invention.
Figure 3:
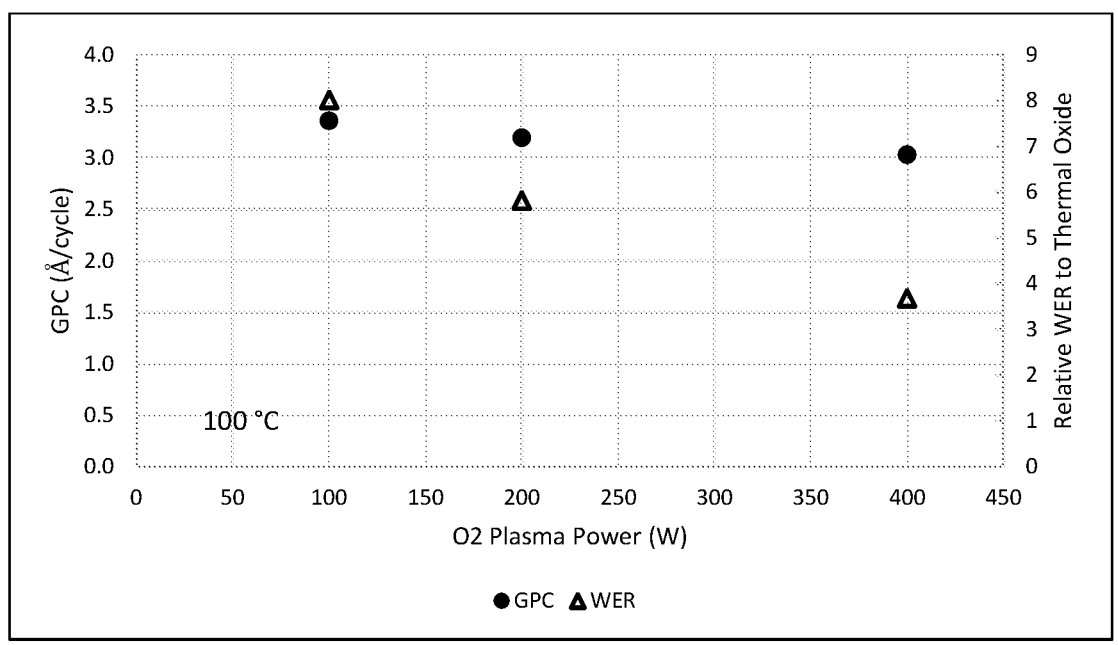
FIG. 3 shows the film GPC and WER versus O2 plasma power using bis(dimethylamino)-2,4,6,8-tetramethylcyclotetrasiloxane at 100° C. deposition according to the present invention.
Figure 4:
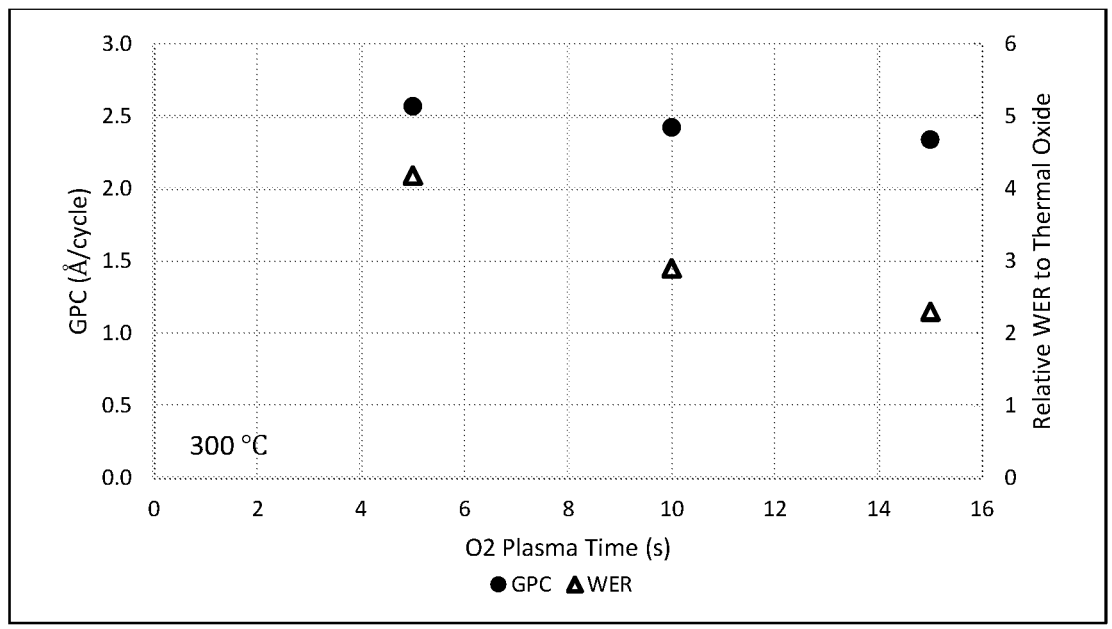
FIG. 4 shows the film GPC and WER versus O2 plasma time using bis(dimethylamino)-2,4,6,8-tetramethylcyclotetrasiloxane at 300° C. deposition according to the present invention.
Figure 5:
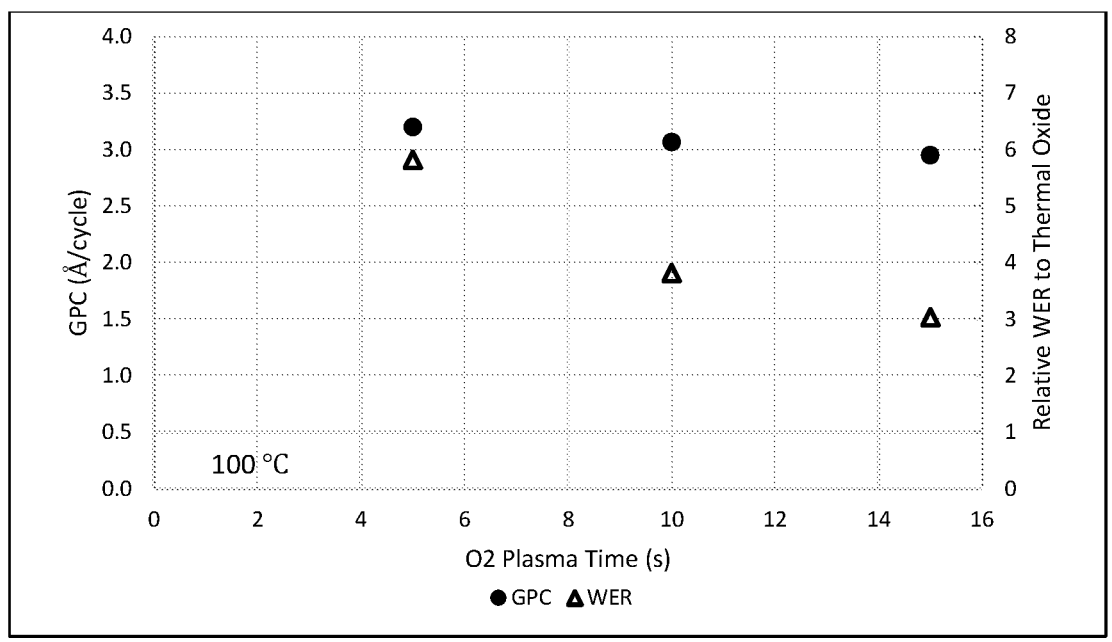
FIG. 5 shows the film GPC and WER versus O2 plasma time using bis(dimethylamino)-2,4,6,8-tetramethylcyclotetrasiloxane at 100° C. deposition according to the present invention.

The film deposition parameters and deposition GPC are shown in Table 3 for 100° C. deposition and Table 4 for 300° C. deposition. Depositions 1-6 and 13-18 show the GPC as a function of precursor pulse time deposition at 100° C. and 300° C. FIG. 1 shows the saturation curve of bis(dimethylamino)-2,4,6,8-tetramethylcyclotetrasiloxane GPC versus number of precursor pulses. It can be seen that GPC increases with precursor pulses and then saturates, indicating ALD behavior of the precursor. 100° C. depositions show higher GPC than 300° C. depositions. BDEAS (bis (diethylamino)silane) depositions were shown for comparison in FIG. 1. The BDEAS container was heated to 28° C. and had a similar internal vapor pressure to the bis(dimethylamino)-2,4,6,8-tetramethylcyclotetrasiloxane container at 62° C. BDEAS was delivered to chamber with carrier gas Ar flow of 200 sccm. Bis(dimethylamino)-2,4,6,8-tetramethylcyclotetrasiloxane shows much higher GPC than BDEAS. Depositions 7-12 and 19-24 show GPC and film relative WER at varying deposition pressure, oxygen plasma time, or oxygen plasma power. FIG. 2 and FIG. 3 show the film GPC and WER versus O2 plasma power at 300° C. and 100° C. deposition temperatures, respectively, when bis(dimethylamino)-2,4,6,8-tetramethylcyclotetrasiloxane was used as the silicon precursor. GPC slightly decreased with increased oxygen plasma power, and WER decreased with increased oxygen plasma power. Films deposited at high temperature give lower WER. FIG. 4 and FIG. 5 shows film GPC and WER versus O2 plasma time at 300° C. and 100° C. deposition, respectively, when bis(dimethylamino)-2,4,6,8-tetramethylcyclotetrasiloxane was used as the silicon precursor. GPC slightly decreased with increased oxygen plasma time, and WER decreased with increased oxygen plasma time. The lower WER of the film indicates higher film quality.

TABLE 3

PEALD Silicon Oxide Film Deposition Parameters and Deposition GPC by bis(dimethylamino)-2,4,6,8-tetramethylcyclotetrasiloxane at 100° C.

| Dep No. | Dep T (° C.) | Reactor Pressure (Torr) | Precursor flow (s) | O2 Plasma time (s) | O2 Plasma Power (w) | No of cycles | RI | GPC (Å/cycle) | Nonuniformity (%) | Relative WER to thermal oxide |
|---|---|---|---|---|---|---|---|---|---|---|
| 1 | 100 | 3 | 0.5 | 5 | 200 | 100 | 1.444 | 2.92 | 0.61 | |
| 2 | 100 | 3 | 1 | 5 | 200 | 100 | 1.444 | 3.02 | 0.54 | |
| 3 | 100 | 3 | 2 | 5 | 200 | 100 | 1.443 | 3.10 | 0.32 | |

TABLE 3-continued

PEALD Silicon Oxide Film Deposition Parameters and Deposition GPC by
bis(dimethylamino)-2,4,6,8-tetramethylcyclotetrasiloxane at 100° C.

| Dep No. | Dep T (° C.) | Reactor Pressure (Torr) | Precursor flow (s) | O2 Plasma time (s) | O2 Plasma Power (w) | No of cycles | RI | GPC (Å/cycle) | Nonuniformity (%) | Relative WER to thermal oxide |
|---|---|---|---|---|---|---|---|---|---|---|
| 4 | 100 | 3 | 4 | 5 | 200 | 100 | 1.442 | 3.18 | 0.49 | |
| 5 | 100 | 3 | 8 | 5 | 200 | 100 | 1.440 | 3.23 | 0.63 | |
| 6 | 100 | 3 | 12 | 5 | 200 | 100 | 1.445 | 3.28 | 0.52 | |
| 7 | 100 | 3 | 8 | 5 | 200 | 200 | 1.442 | 3.22 | 0.50 | 6.0 |
| 8 | 100 | 2 | 8 | 5 | 100 | 200 | 1.438 | 3.36 | 0.69 | 8.0 |
| 9 | 100 | 2 | 8 | 5 | 400 | 200 | 1.446 | 3.04 | 0.54 | 3.7 |
| 10 | 100 | 2 | 8 | 5 | 200 | 200 | 1.442 | 3.20 | 0.63 | 5.8 |
| 11 | 100 | 2 | 8 | 10 | 200 | 200 | 1.433 | 3.06 | 0.86 | 3.8 |
| 12 | 100 | 2 | 8 | 15 | 200 | 200 | 1.435 | 2.95 | 0.51 | 3.0 |

TABLE 4

PEALD Silicon Oxide Film Deposition Parameters and Deposition GPC by
bis(dimethylamino)-2,4,6,8-tetramethylcyclotetrasiloxane at 300° C.

| Dep No. | Dep T (° C.) | Reactor Pressure (Torr) | Precursor flow (s) | O2 Plasma time (s) | O2 Plasma Power (w) | No of cycles | RI | GPC (Å/cycle) | Nonuniformity (%) | Relative WER |
|---|---|---|---|---|---|---|---|---|---|---|
| 13 | 300 | 3 | 0.5 | 5 | 200 | 100 | 1.427 | 2.28 | 1.87 | |
| 14 | 300 | 3 | 1 | 5 | 200 | 100 | 1.430 | 2.42 | 0.95 | |
| 15 | 300 | 3 | 2 | 5 | 200 | 100 | 1.437 | 2.52 | 0.63 | |
| 16 | 300 | 3 | 4 | 5 | 200 | 100 | 1.434 | 2.64 | 0.76 | |
| 17 | 300 | 3 | 8 | 5 | 200 | 100 | 1.432 | 2.67 | 0.79 | |
| 18 | 300 | 3 | 12 | 5 | 200 | 100 | 1.447 | 2.68 | 0.77 | |
| 19 | 300 | 3 | 8 | 5 | 200 | 200 | 1.431 | 2.61 | 0.83 | 4.7 |
| 20 | 300 | 2 | 8 | 5 | 100 | 200 | 1.428 | 2.72 | 0.85 | 6.7 |
| 21 | 300 | 2 | 8 | 5 | 400 | 200 | 1.436 | 2.41 | 0.80 | 1.8 |
| 22 | 300 | 2 | 8 | 5 | 200 | 200 | 1.428 | 2.57 | 0.78 | 4.2 |
| 23 | 300 | 2 | 8 | 10 | 200 | 200 | 1.431 | 2.42 | 0.87 | 2.9 |
| 24 | 300 | 2 | 8 | 15 | 200 | 200 | 1.434 | 2.34 | 1.01 | 2.3 |

Comparative Example 12a. PEALD Silicon Oxide Using TMCTS (2,4,6,8-Tetramethylcyclotetrasiloxane) in Laminar Flow Reactor with 27.1 MHz Plasma Depositions were performed with TMCTS as silicon precursor and 02 plasma reactant. TMCTS was delivered to the chamber by vapor draw method, no carrier gas was used. Steps b to e in Table 2 were repeated many times to get a desired thickness of silicon oxide for metrology. The film deposition parameters and deposition GPC and wafer uniformity are shown in Table 5. The deposition wafer showed poor uniformity and GPC did not show saturation with increasing precursor pulse, indicating CVD deposition for TMCTS, thus not suitable as ALD precursor.

TABLE 5

PEALD Silicon Oxide Film Deposition Parameters
and Deposition GPC, Wafer Uniformity by TMCTS

| Dep T (° C.) | Chamber Pressure (Torr) | Reactor Pressure (Torr) | Precursor Flow (s) | $O_2$ Plasma Time (s) | $O_2$ Plasma Power (W) | GPC (Å/cycle) | Uniformity (%) |
|---|---|---|---|---|---|---|---|
| 100 | 2.5 | 3 | 0.5 | 5 | 200 | 0.76 | 31.8 |
| 100 | 2.5 | 3 | 1 | 5 | 200 | 1.67 | 41.0 |
| 100 | 2.5 | 3 | 2 | 5 | 200 | 2.70 | 6.6 |

Comparative Example 12b. PEALD Silicon Oxide Using BDEAS (Bis(Diethylamino)Silane) in Laminar Flow Reactor with 27.1 MHz Plasma Depositions were performed with BDEAS as silicon precursor and $O_2$ plasma under conditions as described above in Table 2. Precursor was delivered to chamber with carrier gas Ar flow of 200 sccm. Steps b to e were repeated many times to get a desired thickness of silicon oxide for metrology. The film deposition parameters and deposition GPC are shown in Table 6. FIG. 1 shows the GPC versus different precursor flow time. It shows much lower GPC than bis(dimethylamino)-2,4,6,8-tetramethylcyclotetrasiloxane.

TABLE 6

PEALD Silicon Oxide Film Deposition Parameters and Deposition GPC by BDEAS

| Process Condition | Dep T (° C.) | Reactor Pressure (Torr) | Precursor flow (s) | Oxygen Plasma time (s) | Oxygen Plasma Power (W) | No. of cycles | GPC (Å/cycle) |
|---|---|---|---|---|---|---|---|
| 1 | 300 | 3 | 0.2 | 5 | 200 | 100 | 0.95 |
| 2 | 300 | 3 | 0.5 | 5 | 200 | 100 | 1.17 |
| 3 | 300 | 2 | 1 | 5 | 200 | 100 | 1.23 |
| 4 | 300 | 2 | 2 | 5 | 200 | 100 | 1.26 |
| 5 | 300 | 2 | 4 | 5 | 200 | 100 | 1.27 |

Example 13. PEALD Silicon Oxide Using 2-Dimethylamino-2,4,6,8,10-Pentamethylcyclopentasiloxane in Laminar Flow Reactor with 27.1 MHz Plasma Depositions were performed with 2-dimethylamino-2,4,6,8,10-pentamethylcyclopentasiloxane as the silicon precursor and $O_2$ plasma under conditions as described above in Table 2. The precursor was delivered to the chamber with carrier gas Ar flow of 200 sccm. The container was heated to 50° C. Steps b to e were repeated many times to get a desired thickness of silicon oxide for metrology. The film deposition parameters and deposition GPC, film RI and relative WER to thermal oxide are shown in Table 7 and Table 8. FIG. 1 shows the saturation curve of 2-dimethylamino-2,4,6,8,10-pentamethylcyclopentasiloxane GPC versus number of precursor pulses. It can be seen that GPC increases with precursor pulses and then saturates, indicating ALD behavior of the precursor. 100° C. depositions show higher GPC than 300° C. depositions. BDEAS (bis(diethylamino)silane) depositions were shown for comparison in FIG. 1. The film GPC is very high when using the 2-dimethylamino-2,4,6,8,10-pentamethylcyclopentasiloxane precursor: around 3.6 Å/cycle at 300° C. deposition temperature and 4.6 Å/cycle at 100° C. deposition temperature. Higher $O_2$ plasma time or longer $O_2$ plasma time decreases growth rate and decreases film relative WER, indicating improved film quality.

TABLE 7

PEALD Silicon Oxide Film Deposition Parameters and Deposition GPC by 2-dimethylamino-2,4,6,8,10-pentamethylcyclopentasiloxane at 100° C.

| Dep T (° C.) | Reactor Pressure (Torr) | Precursor pulse time (s) | Plasma Time (s) | Plasma Power (W) | No. of cycles | Thickness (Å) | GPC (Å/cycle) | RI | Relative WER |
|---|---|---|---|---|---|---|---|---|---|
| 300 | 3 | 2 | 5 | 200 | 100 | 333 | 3.33 | 1.456 | |
| 300 | 3 | 4 | 5 | 200 | 100 | 349 | 3.49 | 1.450 | |
| 300 | 3 | 8 | 5 | 200 | 100 | 364 | 3.64 | 1.450 | |
| 300 | 2 | 8 | 5 | 400 | 200 | 693 | 3.47 | 1.448 | 3.63 |
| 300 | 2 | 8 | 5 | 200 | 200 | 692 | 3.46 | 1.445 | 5.99 |
| 300 | 2 | 8 | 10 | 200 | 200 | 647 | 3.24 | 1.444 | 4.15 |

TABLE 8

PEALD Silicon Oxide Film Deposition Parameters and Deposition GPC by
2-dimethylamino-2,4,6,8,10-pentamethylcyclopentasiloxane at 300° C.

| Dep T (° C.) | Reactor Pressure (Torr) | Precursor pulse time (s) | Plasma Time (s) | Plasma Power (W) | No. of cycles | Thickness (Å) | GPC (Å/cycle) | RI | Relative WER |
|---|---|---|---|---|---|---|---|---|---|
| 100 | 3 | 2 | 5 | 200 | 100 | 438 | 4.38 | 1.456 | |
| 100 | 3 | 4 | 5 | 200 | 100 | 451 | 4.51 | 1.453 | |
| 100 | 3 | 8 | 5 | 200 | 100 | 464 | 4.64 | 1.458 | |
| 100 | 2 | 8 | 5 | 400 | 200 | 847 | 4.24 | 1.459 | 5.42 |
| 100 | 2 | 8 | 5 | 200 | 200 | 902 | 4.51 | 1.455 | 9.35 |
| 100 | 2 | 8 | 10 | 200 | 200 | 851 | 4.26 | 1.458 | 5.57 |

Example 14. Thermal ALD Silicon Oxide Using 2-dimethylamino-2,4,6,8,10-pentamethylcyclopentasiloxane and ozone (prophetic)

Thermal Atomic Layer Depositions of silicon oxide films are performed on a laboratory scale ALD processing tool. The silicon precursor, 2-dimethylamino-2,4,6,8,10-pentamethylcyclopentasiloxane, is delivered to the chamber by vapor draw. All gases (e.g., purge and reactant gas or precursor and oxygen source) are preheated to 10000 prior to entering the deposition zone. Gases and precursor flow rates are controlled with ALD diaphragm valves with high speed actuation. The substrates used in the deposition are 12-inch-long silicon strips. A thermocouple is attached on the sample holder to confirm substrate temperature. Depositions are performed using ozone as oxygen source gas. Normal deposition process and parameters are shown in Table 9. Steps 1 to 6 are repeated until a desired thickness is reached.

TABLE 9

Process for Thermal Atomic Layer Deposition of Silicon Oxide Films with Ozone as the Oxygen Source on the Laboratory Scale ALD Processing Tool.

| Step 1 | 6 sec | Evacuate reactor | <100 mT |
| Step 2 | variable | Dose silicon precursor | Reactor pressure typically <2 Torr |
| Step 3 | 6 sec | Purge reactor with nitrogen | Flow 1.5 slpm $N_2$ |
| Step 4 | 6 sec | Evacuate reactor | <100 mT |
| Step 5 | variable | Dose oxygen source ozone | |
| Step 6 | 6 sec | Purge reactor with nitrogen | Flow 1.5 slpm $N_2$ |

For a deposition temperature of 300° C., the growth per cycle (GPC) of the deposited thin film is expected to be greater than 2.5 Å/cycle. A pure silicon oxide film is formed with <0.1 at % carbon and <0.1 at % nitrogen impurities as measured by XPS. For a deposition temperature of 100° C., the film is expected to be a carbon-doped silicon oxide film with carbon content >10 at % as measured by XPS, and film WER is expected to be less than thermal oxide film WER using 1:99 (0.5 wt. %) diluted hydrofluoric (HF) acid solution. With thermal annealing at temperature between 300° C. to 650° C. or hydrogen plasma treatment, the film is expected to have a k value <3.5.

Although the disclosure has been described with reference to certain preferred embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments, but that the invention will include all embodiments falling within the scope of the appended claims.

The invention claimed is:

1. A method for depositing a film comprising silicon and oxygen onto a substrate, the method comprising the steps of:
   a) providing a substrate in a reactor;
   b) introducing into the reactor at least one silicon precursor compound selected from the group consisting of Formulae A-D

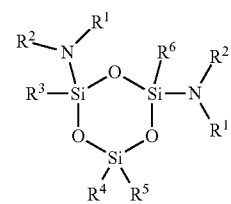

A

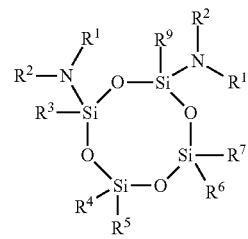

B

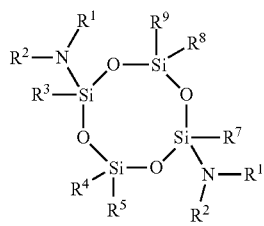

C

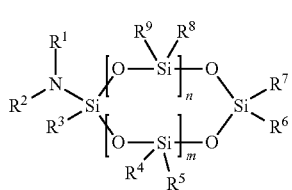

D wherein $R^1$ is selected from the group consisting of a linear $C_1$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group; $R^2$ is selected from the group consisting of hydrogen, a $C_1$ to $C_{10}$ linear alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group, wherein $R^1$ and $R^2$ are either linked to form a cyclic ring structure or are not linked to form a cyclic ring structure; $R^{3-11}$ are each independently selected from the group consisting of hydrogen, a linear $C_1$ to $C_{10}$ alkyl group, a branched $C_3$ to $C_{10}$ alkyl group, a $C_3$ to $C_{10}$ cyclic alkyl group, a $C_2$ to $C_{10}$ alkenyl group, a $C_2$ to $C_{10}$ alkynyl group, a $C_4$ to $C_{10}$ aryl group, and an organoamino group, $NR^1R^2$, wherein $R^1$ and $R^2$ are defined above; n=1, 2, or 3, and m=2 or 3;

c) purging the reactor with a purge gas;
d) introducing at least one of an oxygen-containing source and a nitrogen-containing source into the reactor; and
e) purging the reactor with the purge gas,
wherein the steps b through e are repeated until a desired thickness of film is deposited;
and wherein the method is conducted at one or more temperatures ranging from about 25° C. to 600° C.

2. The method of claim 1 wherein each of $R^{3-9}$ is independently selected from the group consisting of hydrogen and a $C_1$ to $C_4$ alkyl group.

3. The method of claim 1, wherein $R^1$ is selected from the group consisting of a $C_3$ to $C_{10}$ cyclic alkyl group and a $C_4$ to $C_{10}$ aryl group.

4. The method of claim 1, wherein the at least one silicon precursor compound is selected from the group consisting of 2,4-bis(dimethylamino)-2,4,6-trimethylcyclotrisiloxane, 2,4-bis(dimethylamino)-2,4,6,6-tetramethylcyclotrisiloxane, 2,4-bis(dimethylamino)-2,4,6,8-tetramethylcyclotetrasiloxane, 2,4-bis(dimethylamino)-2,4,6,6,8,8-hexamethylcyclotetrasiloxane, 2,6-bis(dimethylamino)-2,4,6,8-tetramethylcyclotetrasiloxane, 2,6-bis(dimethylamino)-2,4,4,6,8,8-hexamethylcyclotetrasiloxane, 2-dimethylamino-2,4,6,8,10-pentamethylcyclopentasiloxane, 2-dimethylamino-2,4,4,6,6,8,8,10,10-nonamethylcyclopentasiloxane, 2,4-bis(methylamino)-2,4,6-trimethylcyclotrisiloxane, 2,4-bis(methylamino)-2,4,6,6-tetramethylcyclotrisiloxane, 2,4-bis(methylamino)-2,4,6,8-tetramethylcyclotetrasiloxane, 2,4-bis(methylamino)-2,4,6,6,8,8-hexamethylcyclotetrasiloxane, 2,6-bis(methylamino)-2,4,6,8-tetramethylcyclotetrasiloxane, 2,6-bis(methylamino)-2,4,4,6,8,8-hexamethylcyclotetrasiloxane, 2-methylamino-2,4,6,8,10-pentamethylcyclopentasiloxane 2-methylamino-2,4,4,6,6,8,8,10,10-nonamethylcyclopentasiloxane, 2,4-bis(iso-propylamino)-2,4,6-trimethylcyclotrisiloxane, 2,4-bis(iso-propylamino)-2,4,6,6-tetramethylcyclotrisiloxane, 2,4-bis(iso-propylamino)-2,4,6,8-tetramethylcyclotetrasiloxane, 2,4-bis(iso-propylamino)-2,4,6,6,8,8-hexamethylcyclotetrasiloxane, 2,6-bis(iso-propylamino)-2,4,6,8-tetramethylcyclotetrasiloxane, 2,6-bis(iso-propylamino)-2,4,4,6,8,8-hexamethylcyclotetrasiloxane, 2-iso-propylamino-2,4,6,8,10-pentamethylcyclopentasiloxane, 2-iso-propylamino-2,4,4,6,6,8,8,10,10-nonamethylcyclopentasiloxane, 2,4-bis(N-ethylmethylamino)-2,4,6-trimethylcyclotrisiloxane, 2,4-bis(N-ethylmethylamino)-2,4,6,6-tetramethylcyclotrisiloxane, 2,4-bis(N-ethylmethylamino)-2,4,6,8-tetramethylcyclotetrasiloxane, 2,4-bis(N-ethylmethylamino)-2,4,6,6,8,8-hexamethylcyclotetrasiloxane, 2,6-bis(N-ethylmethylamino)-2,4,6,8-tetramethylcyclotetrasiloxane, 2,6-bis(N-ethylmethylamino)-2,4,4,6,8,8-hexamethylcyclotetrasiloxane, 2-(N-ethylmethylamino)-2,4,6,8,10-pentamethylcyclopentasiloxane, 2-(N-ethylmethylamino)-2,4,4,6,6,8,8,10,10-nonamethylcyclopentasiloxane, 2,4-bis(diethylamino)-2,4,6-trimethylcyclotrisiloxane, 2,4-bis(diethylamino)-2,4,6,6-tetramethylcyclotrisiloxane, 2,4-bis(diethylamino)-2,4,6,8-tetramethylcyclotetrasiloxane, 2,4-bis(diethylamino)-2,4,6,6,8,8-hexamethylcyclotetrasiloxane, 2,6-bis(diethylamino)-2,4,6,8-tetramethylcyclotetrasiloxane, 2,6-bis(diethylamino)-2,4,4,6,8,8-hexamethylcyclotetrasiloxane, 2-diethylamino-2,4,6,8,10-pentamethylcyclopentasiloxane, 2-diethylamino-2,4,4,6,6,8,8,10,10-nonamethylcyclopentasiloxane, 2,4,6-tris(dimethylamino)-2,4,6-trimethylcyclotrisiloxane, 2,4,6,8-tetrakis(dimethylamino)-2,4,6,8-tetramethylcyclotetrasiloxane, 2,4,6-tris(methylamino)-2,4,6-trimethylcyclotrisiloxane, 2,4,6,8-tetrakis(methylamino)-2,4,6,8-tetramethylcyclotetrasiloxane.

5. The method of claim 1 wherein the silicon precursor compound further comprising at least one selected from the group consisting of a solvent and an inert gas.

* * * * *